(12) United States Patent
Park et al.

(10) Patent No.: US 7,417,902 B2
(45) Date of Patent: Aug. 26, 2008

(54) INPUT CIRCUIT FOR A MEMORY DEVICE, AND A MEMORY DEVICE AND MEMORY SYSTEM EMPLOYING THE INPUT CIRCUIT

(75) Inventors: Moon-Sook Park, Seoul (KR); Kyu-hyoun Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 213 days.

(21) Appl. No.: 11/325,343

(22) Filed: Jan. 5, 2006

(65) Prior Publication Data

US 2007/0058454 A1    Mar. 15, 2007

(30) Foreign Application Priority Data

Sep. 9, 2005    (KR) ...................... 10-2005-0084016

(51) Int. Cl.
G11C 7/06    (2006.01)

(52) U.S. Cl. .............. 365/189.07; 365/201; 365/189.09

(58) Field of Classification Search ............ 365/189.07, 365/201, 189.09
See application file for complete search history.

(56) References Cited

U.S. PATENT DOCUMENTS

| | | | |
|---|---|---|---|
| 5,287,063 A | 2/1994 | Izawa | |
| 5,821,795 A | 10/1998 | Yasuda et al. | |
| 6,282,210 B1 | 8/2001 | Rapport et al. | |
| 6,459,620 B1 * | 10/2002 | Eshel | 365/185.21 |
| 6,662,304 B2 | 12/2003 | Keeth et al. | |
| 6,826,390 B1 * | 11/2004 | Tamura | 455/226.1 |

* cited by examiner

Primary Examiner—Son Dinh
Assistant Examiner—Nam Nguyen
(74) Attorney, Agent, or Firm—Harness, Dickey & Pierce

(57) ABSTRACT

In one embodiment, the input circuit includes a receiver circuit that generates a data signal based on a pair of differential data signals. A detecting circuit detects an offset voltage between the pair of differential data signals, and an adjusting circuit adjusts operation of the receiver to reduce a magnitude of the detected offset voltage based on the detected offset voltage.

46 Claims, 16 Drawing Sheets

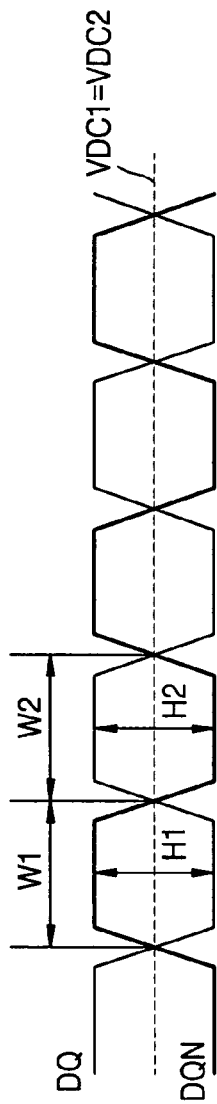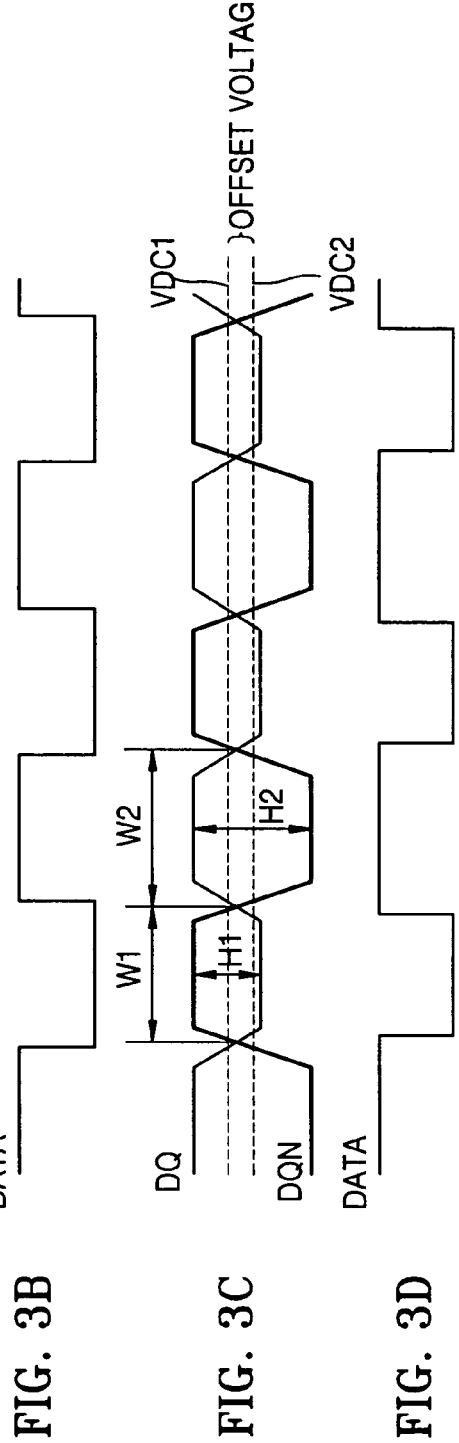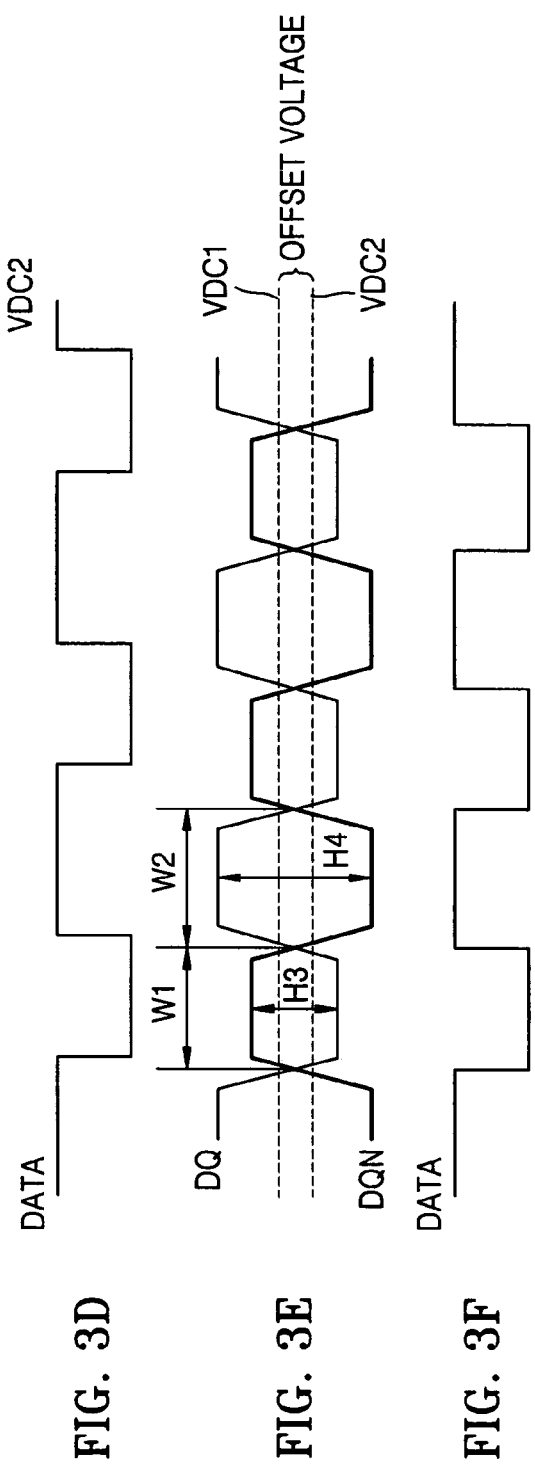
FIG. 3A
FIG. 3B
FIG. 3C
FIG. 3D
FIG. 3E
FIG. 3F

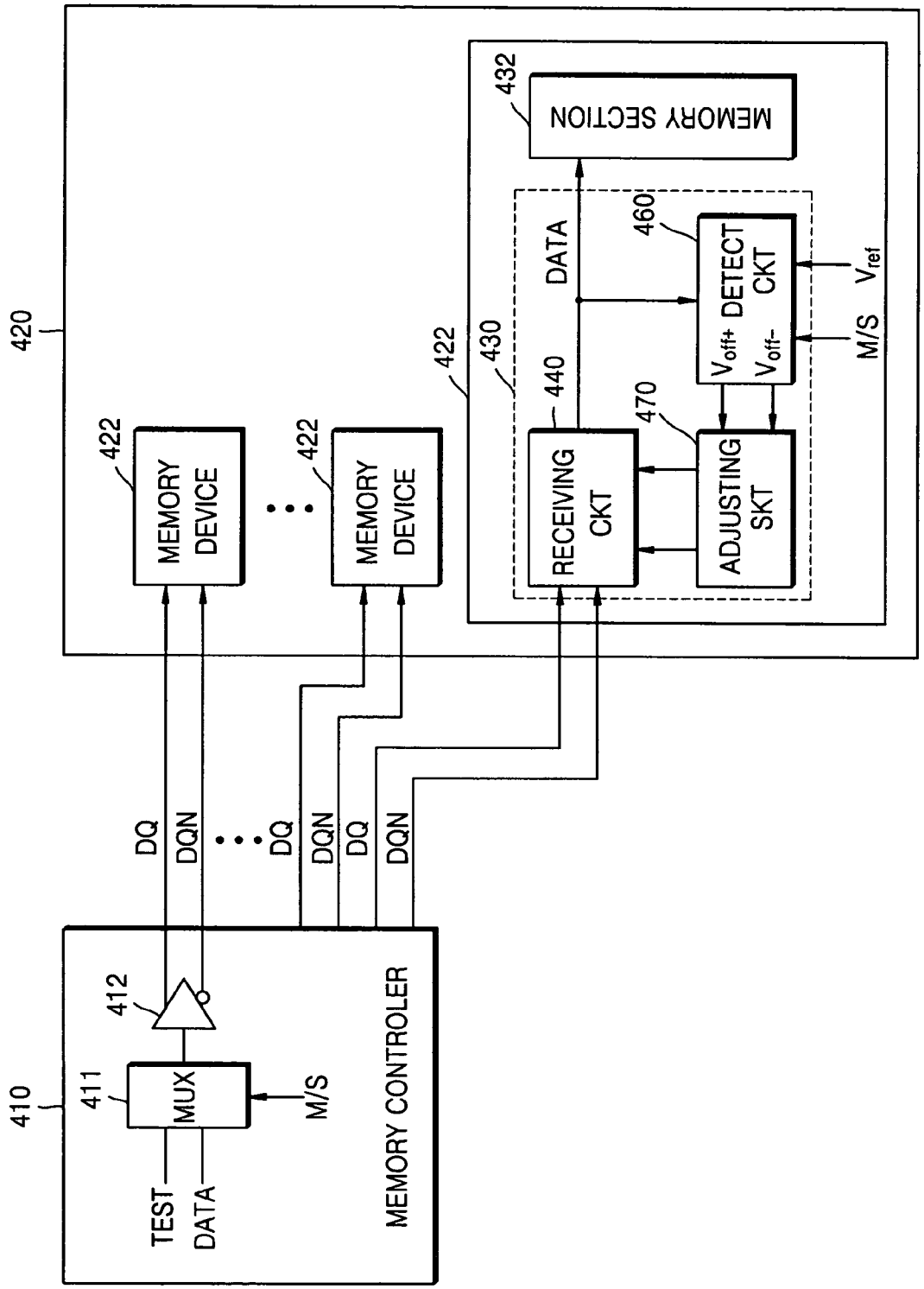

US 7,417,902 B2

INPUT CIRCUIT FOR A MEMORY DEVICE, AND A MEMORY DEVICE AND MEMORY SYSTEM EMPLOYING THE INPUT CIRCUIT

FOREIGN PRIORITY INFORMATION

This invention claims priority under 35 U.S.C. 119 on Korean Application No. P2005-84016, filed Sep. 9, 2005; the entire contents of which are hereby incorporated by reference.

BACKGROUND OF THE INVENTION

FIG. 1 illustrates a prior art memory system. As shown, a memory controller 110 outputs a pair of differential data signals DQ and DQN to a memory module 120; for example, during a write operation. The memory module 120 includes a plurality of memory devices 122. Each memory device 122 may receive a pair of differential data signals DQ and DQN through each of a plurality of data signal lines on the motherboard. More specifically, each memory device 122 includes an input circuit 124 for receiving the differential data signals DQ and DQN and outputting a data signal represented by the differential data signals DQ and DQN. A memory section 126 of the memory device 122 may store the data represented by the data signal.

While not shown, it will be appreciated that a memory device 122 may also output differential data signals to the memory controller 110; for example, during a read operation (e.g., reading data from a memory section 126 of a memory device 122). And, while not shown, the memory controller 110 also includes an input circuit for receiving the differential data signals and generating a data signal therefrom.

For the purposes of explanation only, operation of the input circuit 124 at a memory device 122 will be described; however, it will be understood that the same operation may occur at the memory controller 110.

FIG. 2 illustrates portions of the conventional memory system in greater detail. As shown, at the memory controller 110, a well-known differential driver 112 generates the pair of differential data signals DQ and DQN based on input data D and DN, where DN is a voltage representing the logical inverse of that represented by the voltage D.

The first differential data signal DQ travels to the input circuit 124 of a memory device 122 via a first path PATH1 and the second differential data signal DQN travels to the input circuit 124 via a second path PATH2. The input circuit 124 is a differential amplifier DA that differentially amplifies the differential data signals to generate a data signal DATA.

FIG. 3A illustrates a waveform diagram of ideally generated differential data signals for data alternating between logic high and logic low, and FIG. 3B illustrates a waveform of a data signal generated from the ideal differential data signals. As shown by FIG. 3A, the second differential data signal DQN is ideally the inverse of the first differential data signal DQ such that the first and second differential data signals DQ and DQN transition between the same low and high voltages. As such, the first and second differential data signals DQ and DQN form an eye pattern wherein (1) each eye representing a logic low data signal has height HI equal to the height H2 of each eye representing a logic high data signal and (2) each eye representing a logic low data signal has a time interval or width W1 equal to the width W2 of each eye representing a logic high data signal. As further shown in FIG. 3A, the DC voltage VDC1 of the first differential data signal DQ is the same as the DC voltage VDC2 of the second differential data signal DQN such that no offset between the DC voltages VDC1 and VDC2 exists.

Because of the ideal characteristics of the first and second differential data signals, the resulting data signal has an ideal duty ratio of 50% as shown in FIG. 3B. Namely, the logic high periods of the data signal have the same time length as the logic low periods of the data signal. It should be understood that in normal operation, the differential data signals may represent logic high for two or consecutive periods and may represent logic low for two or more consecutive periods; however, the lengths of a single logic high period and a single logic low period define the duty ratio.

Unfortunately, in practice, the voltage swings of the first and second differential data signals DQ and DQN are not necessarily the same. Due to imperfect manufacturing tolerances, chip mismatch and/or channel mismatch may cause the differential data signals DQ and DQN as received at the input circuit 124 to differ from the ideal.

FIG. 3C illustrates one example case of how the differential data signals DQ and DQN may differ from the ideal shown in FIG. 3A. As shown, the voltage swings of the differential data signals DQ and DQN differ such that (1) each eye representing a logic low data signal has height H1 that is less than the height H2 of each eye representing a logic high data signal and (2) each eye representing a logic low data signal has a time interval or width W1 that is less the width W2 of each eye representing a logic high data signal. As a result, the data signal, as shown in FIG. 3D, may be erroneously generated (e.g., logic low state may not be detected or timely detected), and the data signal will have a duty ratio greater 50%. In that case, the logic low data of the data signal DATA may not be written into the memory cell array of the memory device 122 due to the lack of set up and hold time of the logic low data. Indicative of these conditions, the DC voltage VDC1 of the first differential data signal is greater than the DC voltage VDC2 of the second differential data signal. Thus a DC offset voltage exists between the first and second differential data signals.

FIGS. 3E and 3F illustrate yet another example of non-ideal differential data signals and the resulting data signal. As in the example of FIGS. 3C and 3D, a positive DC offset voltage exists because VDC1 is greater than VDC2; however, it will be appreciated that numerous other example situations exist in which a negative DC offset voltage (i.e., where VDC1 is less than VDC2) occurs. When a negative DC offset voltage occurs, the duty ratio of the resulting data signal may be less than 50%.

SUMMARY OF THE INVENTION

The present invention is directed to an input circuit, and a memory system employing the input circuit; for example, a memory device in the memory system employs the input circuit.

In one embodiment, the input circuit includes a receiver circuit that generates a data signal based on a pair of differential data signals. A detecting circuit detects an offset voltage between the pair of differential data signals, and an adjusting circuit adjusts operation of the receiver to reduce a magnitude of the detected offset voltage based on the detected offset voltage.

In one embodiment, the adjusting circuit adjusts the operation of the receiver such that a duty ratio of the data signal converges towards a 50% duty ratio.

In another embodiment, the detecting circuit detects the offset voltage only during a test mode of the input circuit.

In one example embodiment, the detecting circuit detects the offset voltage based on the generated data signal. In another embodiment, the detecting circuit detects the offset voltage based on output from the adjusting circuit. In these embodiments, the detecting circuit may generate first and second voltages representing the detected offset voltage, and the adjusting circuit may adjust the operation of the receiver based on the first and second voltages.

In one embodiment, the receiver circuit includes a current mirror having a drive side and a driven side. The drive side has an input receiving a first of the pair of differential data signals, and the driven side has an input receiving a second of the pair of differential data signals. The adjusting circuit may selectively pull more current from one of the drive side and the driven side based on the detected offset voltage.

In a further embodiment of the input circuit, a receiver circuit generates a data signal based on a pair of differential data signals, a detecting circuit detects an offset voltage between the pair of differential data signals, and an adjusting circuit adjusts operation of the receiver to converge a duty ratio of the data signal towards 50% based on the detected offset voltage.

In a still further embodiment, the input circuit includes an adjusting circuit receiving a pair of differential data signals and adjusting the pair of differential data signals to generate a pair of adjusted differential data signals such that a magnitude of an offset voltage between the pair of differential data signals is reduced in the pair of adjusted differential data signals. A receiver circuit generates a data signal based on the pair of adjusted differential data signals.

In one embodiment, the adjusting circuit adjusts the pair of differential data signals to generate the pair of adjusted differential data signals such that a duty ratio of the data signal converges towards a 50% duty ratio.

In another embodiment, the adjusting circuit detects the offset voltage between the pair of differential data signals, and detects the offset voltage only during a test mode of the input circuit.

In one example embodiment, the detecting circuit detects the offset voltage based on the generated data signal. In another embodiment, the detecting circuit detects the offset voltage based on output from the adjusting circuit. In these embodiments, the detecting circuit may generate first and second voltages representing the detected offset voltage, and the adjusting circuit may generate the adjusted differential data signals based on the first and second voltages.

In one embodiment, the adjusting circuit includes a first low pass filter filtering a first of the pair of differential data signals, and a second low pass filter filtering a second of the pair of differential data signals. A first generator generates a first of the pair of adjusted differential data signals based on a comparison of the filtered second differential data signal and the second differential data signal. A second generator generates a second of the pair of adjusted differential data signals based on a comparison of the filtered first differential data signal and the first differential data signal.

Yet another embodiment provides an input circuit having a detector detecting an offset voltage between a pair of differential data signals, and a data signal generator generating a data signal based on the pair of differential data signals and the detected offset voltage such that a magnitude of the detected offset voltage is reduced.

Still other embodiments provide memory systems including an input circuit according to an embodiment of the present invention, a memory device including an input circuit according to an embodiment of the present invention, and methods of operation for the input circuit, memory system, memory device, etc.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein:

FIG. 3A illustrates a waveform diagram of ideally generated differential data signals;

FIG. 3B illustrates a waveform of a data signal generated from the ideal differential data signals shown in FIG. 3A;

FIG. 3C illustrates one example case of how the differential data signals may differ from the ideal;

FIG. 3D illustrates a waveform of a data signal generated from the differential data signals shown in FIG. 3C;

FIG. 3E illustrates another example case of how the differential data signals may differ from the ideal;

FIG. 3F illustrates a waveform of a data signal generated from the differential data signals shown in FIG. 3E;

FIG. 4 illustrates a memory system according to a first embodiment of the present invention;

DETAILED DESCRIPTION OF EXAMPLE EMBODIMENTS

Figure 1:
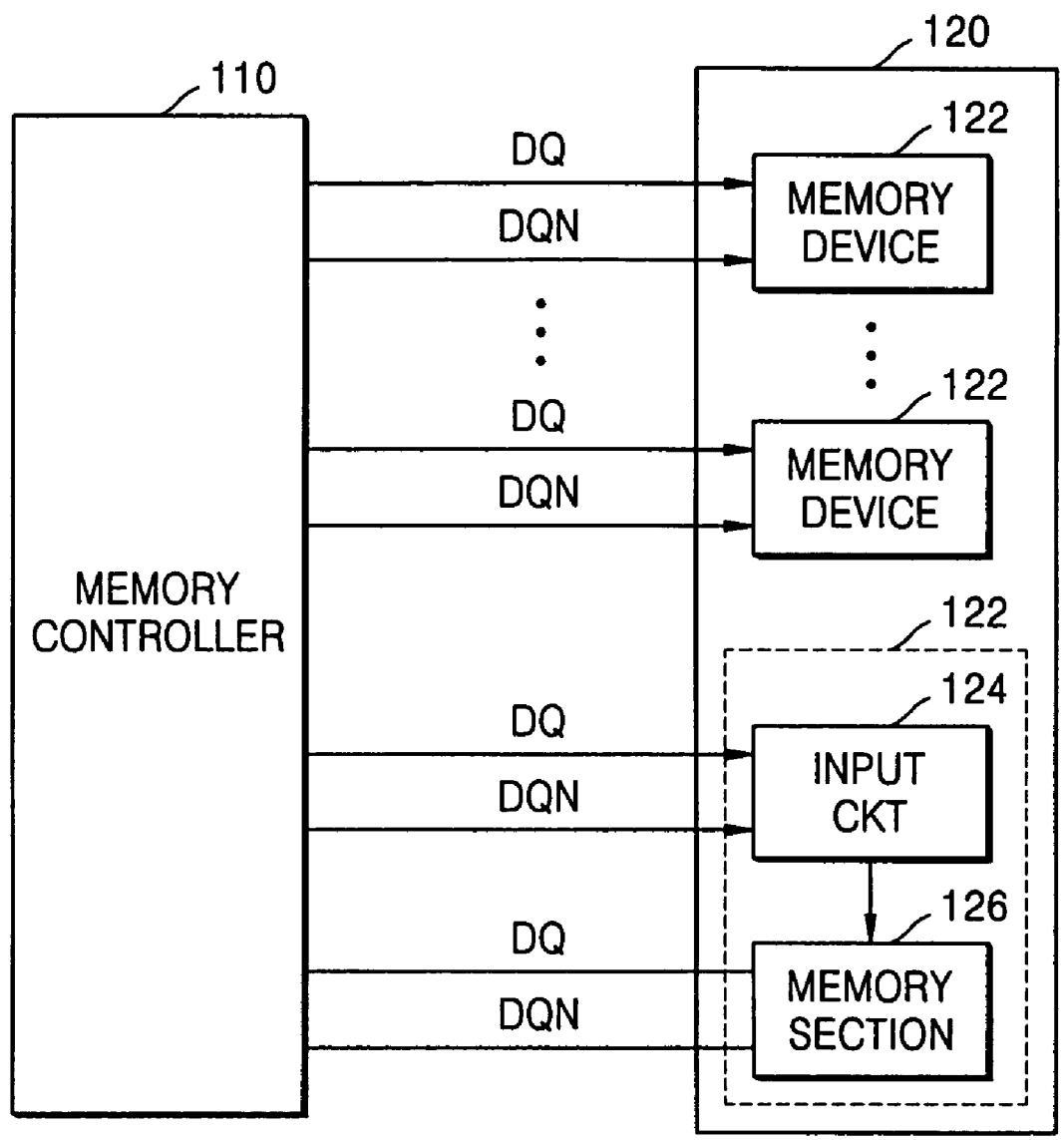
FIG. 1 illustrates a prior art memory system.
Figure 2:
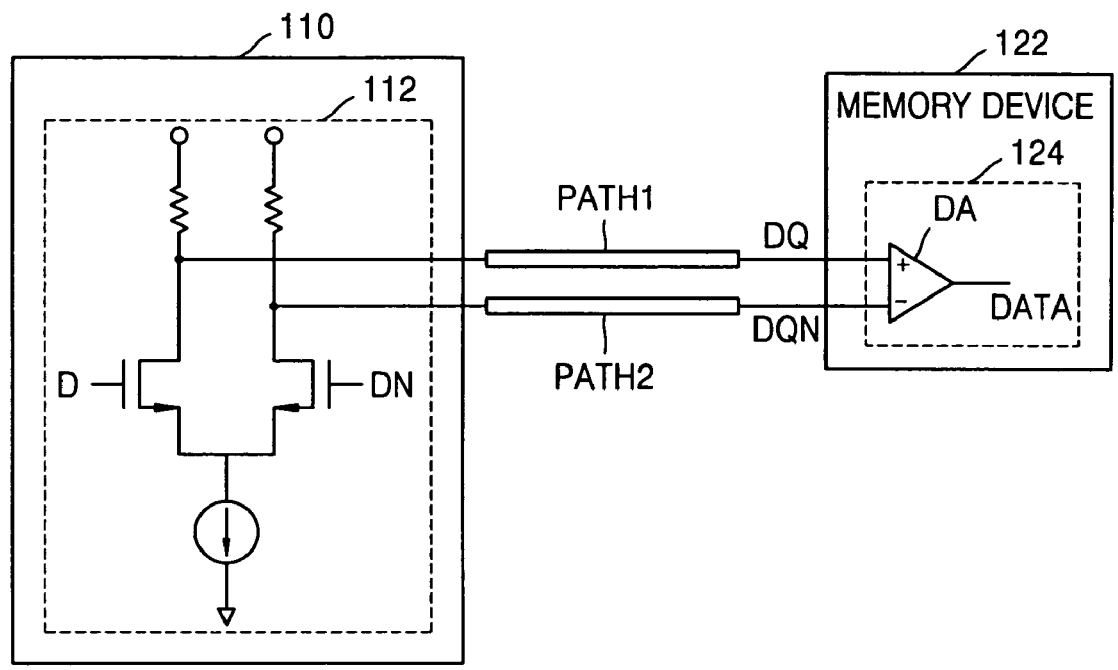
FIG. 2 illustrates portions of the prior art memory system in greater detail.

FIG. 4 illustrates a memory system according to a first embodiment of the present invention. As shown, a memory controller 410 outputs a plurality of pairs of differential data signals DQ and DQN to a memory module 420; for example, during a write operation. The memory module 420 includes a plurality of memory devices 422. Each memory device 422 may receive a pair of differential data signals DQ and DQN respectively from the memory controller 410. More specifically, each memory device 422 includes an input circuit 430 for receiving the differential data signals DQ and DQN and generating a data signal DATA represented by the differential data signals DQ and DQN. A memory section 432 in the memory device 422 may store the data signal.

While not shown, it will be appreciated that a memory device 422 may also output differential data signals to the memory controller 410; for example, during a read operation (e.g., during reading of data from a memory section 432). And, while not shown, the memory controller 410 also includes an input circuit for receiving the differential data signals and generating a data signal therefrom.

For the purposes of explanation only, operation of the input circuit 430 in the memory system will be described with respect to a write operation; however, it will be understood that the same operation may occur at the memory controller 410 during a read operation.

FIG. 4 illustrates portions of the memory controller 410 and the input circuit 430 in greater detail. As shown, at the memory controller 410, a multiplexer 412 receives a normal data signal and a test data signal. The test data signal may represent a string of alternating logic 1s and 0s (e.g., "0101"). The multiplexer 412 receives a mode signal M/S indicating the operating mode of the memory system, and outputs one of the test data signal and the normal data signal based on the mode signal M/S. For example, when the mode signal indicates a test mode (e.g., the M/S signal is a logic high), then the multiplexer 412 outputs the test data signal; and when the mode signal M/S indicates a normal mode (e.g., the M/S signal is logic low), then the multiplexer 412 outputs the normal data signal. A well-known differential driver 414 then generates the pair of differential data signals DQ and DQN based on the data signal.

At the input circuit 430 of a memory device 422, a receiving circuit 440 receives the differential data signals DQ and DQN and generates a data signal DATA. The operation of the receiving circuit 440 will be described in greater detail below with respect to FIG. 7. A detecting circuit 460 receives the generated data signal and a reference voltage Vref; and responsive to the operating mode indicated by the mode signal M/S, the detecting circuit 460 selectively detects the DC offset voltage between the differential data signals DQ and DQN. The detecting circuit 460 further generates a first voltage Voff+ and a second voltage Voff− representing the detected DC offset voltage. The operation of the detecting circuit 460 will be described in greater detail below with respect to FIG. 5

An adjusting circuit 470 receives the first and second voltages Voff+ and Voff−, and adjusts operation of the receiving circuit 440 to decrease the amount of DC offset voltage between the pair of differential data signals DQN and DQ. The operation of the adjusting circuit 470 will also be described in more detail below with respect to FIG. 7.

Figure 5:
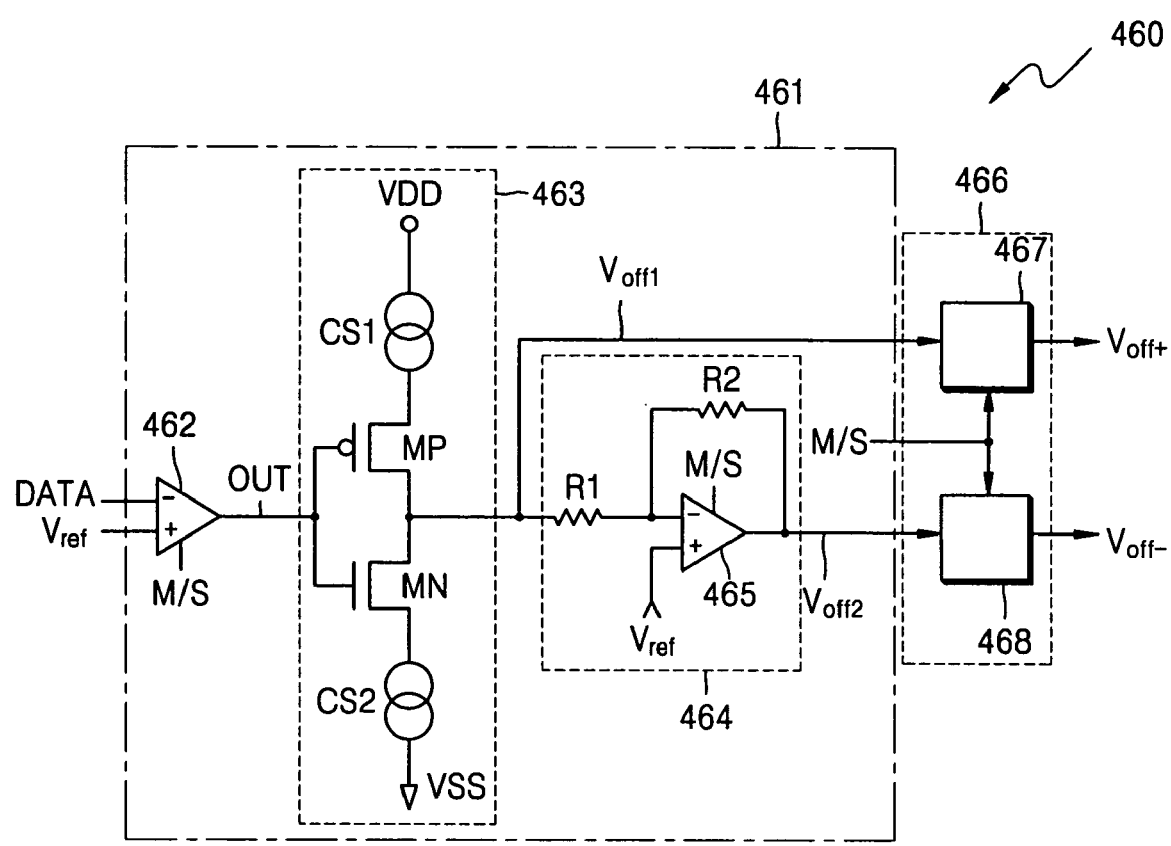
FIG. 5 illustrates a detailed circuit diagram of one embodiment of the detecting circuit 460 shown in FIG. 4.

As alluded to above, FIG. 5 illustrates a detailed circuit diagram of one embodiment of the detecting circuit 460 shown in FIG. 4. As shown, the detecting circuit 460 includes a detection part 461 and a storing part 466. The detection part 461 includes a first differential amplifier 462 selectively comparing the data signal output from the receiving circuit 440 to the reference voltage Vref in response to the mode signal M/S. The reference voltage Vref may equal the ideal DC voltage for the pair of differential data signals DQ and DQN. For example, the reference voltage Vref may equal the first DC voltage VDC1 (and therefore the second DC voltage VDC2) as shown in FIG. 3A. Accordingly, when operational, the differential amplifier 462 generates an output OUT indicative of the DC offset voltage between the pair of differential data signals DQ and DQN as evident in the data signal generated by the receiving circuit 440. The differential amplifier 462 is operational when the mode signal M/S indicates the test mode, and does not operate when the mode signal M/S indicates the normal mode.

Figure 6A:
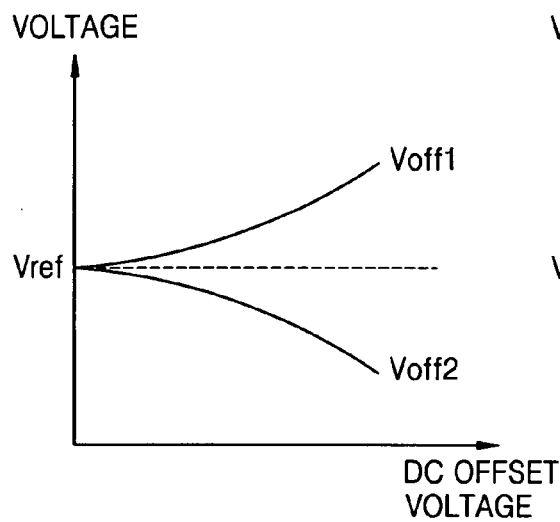
FIGS. 6A and 6B illustrate the relationship between the first and second detection voltages Voff1 and Voff2.
Figure 6B:
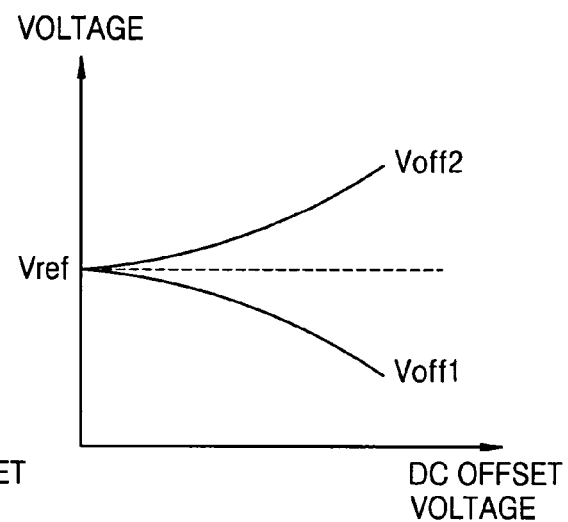

A charge pump circuit 463 receives the output OUT from the differential amplifier 462 and generates a first detection voltage Voff1. The charge pump circuit 463 includes a first constant current source CS1, a PMOS transistor MP, an NMOS transistor MN and a second constant current source CS2 connected in series between a supply voltage VDD and ground VSS. The gates of the PMOS and NMOS transistors MP and MN receive the output OUT from the first differential amplifier 462, and the connection between the PMOS and NMOS transistors MP and MN serves as the output of the charge pump circuit 463. The first detection voltage Voff1 is supplied to the storing part 466 and to a symmetrical inversion circuit 464. The symmetrical inversion circuit 464 includes a second differential amplifier or comparator 465. The positive input of the second differential amplifier 465 receives the reference voltage Vref. The negative input of the second differential amplifier 465 receives the first detection voltage Voff1 via a first resistor R1. The output of the second differential amplifier 465 is connected to the negative input via a second resistor R2. The resistances of the first and second resistors R1 and R2 may be the same. The output of the second differential amplifier 465 is a second detection voltage Voff2. As shown in FIGS. 6A and 6B, the second detection voltage Voff2 is the inverse of the first detection voltage Voff1 symmetrically with respect to the reference voltage Vref. Stated another way, Voff2=Vref−Voff1.

As shown in FIG. 5, the storing part 466 receives the second detection voltage Voff2 in addition to the first detection voltage Voff1. Namely, a first storing circuit 467 stores the first detection voltage Voff1 and a second storing circuit 468 stores the second detection voltage Voff2. The first and second storing circuits 467 and 468 also receive the mode signal M/S. In operation, the first and second storing circuits 467 and 468 store the respectively received first and second detection voltages Voff1 and Voff2 when the mode signal M/S indicates the test mode. However, when the mode signal M/S indicates the normal mode, the first and second detection voltages Voff1 and Voff2 are not stored. As such, during the normal mode, the previously stored first and second detection voltages Voff1 and Voff2; namely, those stored at the end of the last test mode, are output from first and second storing circuits 467 and 468. The output of the first storing circuit 467 serves as the first voltage Voff+ output by the detecting circuit 460, and the output of the second storing circuit 468 serves as the second voltage Voff− output by the detection circuit 460.

Figure 6C:
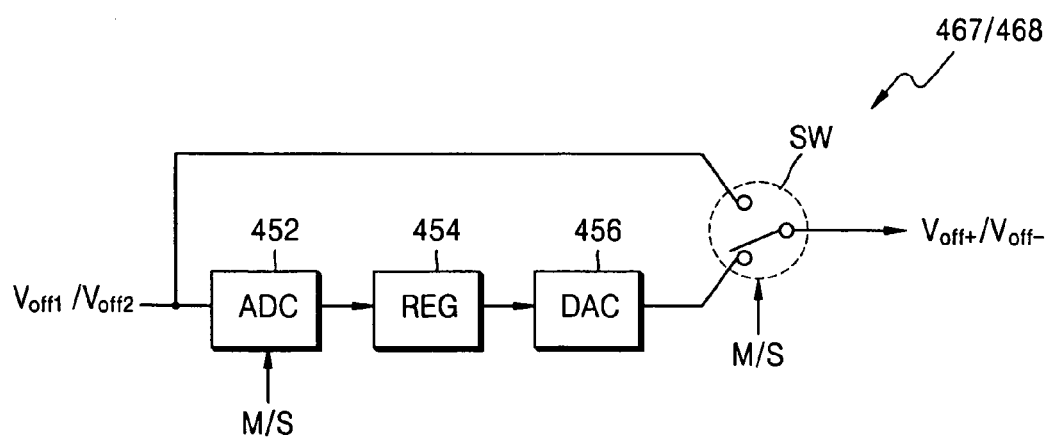
FIG. 6C illustrates an example embodiment of the first and second storing circuits in FIG. 5.

The first and second storing circuits 467 and 468 may have the same structure such as shown in FIG. 6C. As shown, a storing circuit may include an analog-to-digital converter (ADC) 452 converting the detection voltage Voff1/Voff2 to digital. A register 454 stores the digital output from the ADC 452, and a digital-to-analog converter (DAC) 456 converts the output of the register 454 to analog. A switch SW selectively outputs one of the detection voltage Voff1/Voff2 and the output from the DAC 456 in response to the mode signal M/S.

In the test mode, the switch SW selects the detection voltage Voff1/Voff2. In the normal mode, the switch SW selects the output of the DAC 456.

Figure 7:
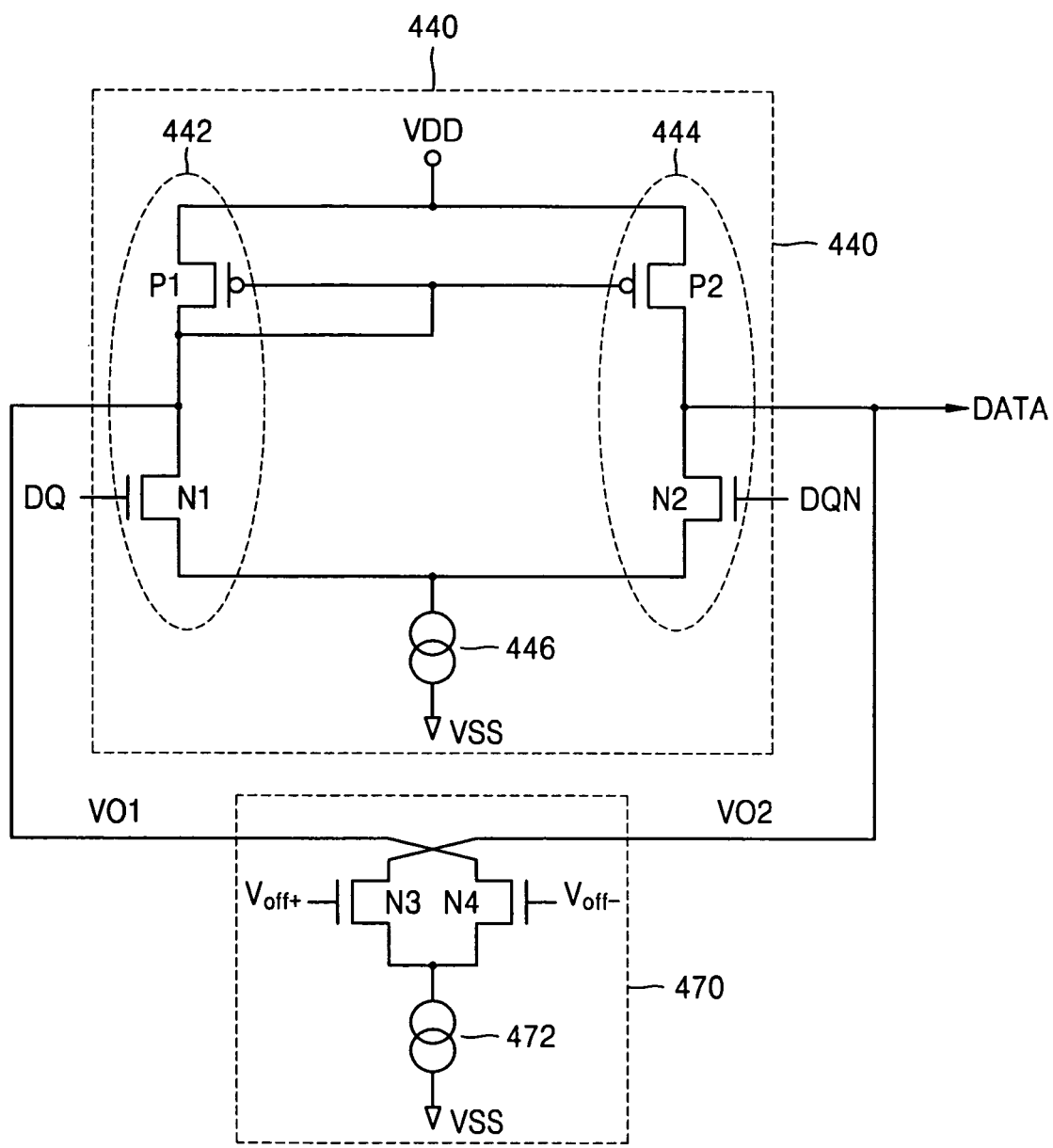
FIG. 7 illustrates a detailed circuit diagram of the receiving circuit and the adjusting circuit in FIG. 4 according to one embodiment of the present invention.

FIG. 7 illustrates the receiving circuit 440 and the adjusting circuit 470 according to one embodiment of the present invention. As shown, the receiving circuit 440 includes a current mirror having a drive side 442 and a driven side 444. The drive side 442 includes a first PMOS transistor P1 and a first NMOS transistor N1 connected in series between the supply voltage VDD and a constant current source 446. The driven side 444 includes a second PMOS transistor P2 and a second NMOS transistor N2 connected in series between the supply voltage VDD and the constant current source 446. The constant current source 446 is connected to ground VSS.

The first PMOS transistor P1 and the second PMOS transistor P2 have their gates connected together and have their gates further connected to the drain of the first PMOS transistor P1. The first NMOS transistor N1 receives the first differential data signal DQ, and the second NMOS transistor N2 receives the second differential data signal DQN. In this embodiment, the connection between the second PMOS transistor P2 and the second NMOS transistor N2 serves as the output of the receiving circuit 440; and therefore, supplies the data signal.

Assuming no DC offset voltage, in operation, when the first differential data signal DQ exceeds the second differential data signal DQN, the drive side 442 drives more current into the driven side 444 such that the data signal swings to a high voltage. When the first differential data signal DQ is exceeded by the second differential data signal DQN, the drive side 442 drives less current into the driven side 444 such that the data signal swings to a low voltage.

As shown in FIG. 7, the adjusting circuit 470 includes a third NMOS transistor N3 connected between the drain of the second PMOS transistor P2 and a constant current source 472, and further includes a fourth NMOS transistor N4 connected between the drain of the first PMOS transistor P1 and the constant current source 472. The constant current source 472 is connected to ground VSS. The gate of the fourth NMOS transistor N4 receives the second voltage Voff−, and the fourth NMOS transistor N4 produces a first adjusting voltage V01. The gate of the third NMOS transistor N3 receives the first voltage Voff+, and the third NMOS transistor N3 produces a second adjusting voltage V02.

When the detecting circuit 460 detects no DC offset voltage (e.g., VDC1=VDC2), then the first voltage Voff+ equals the second voltage Voff−. As such, the third and fourth NMOS transistors N3 and N4 turn on by the same amount and affect the drive side 442 and driven side 444 of the receiving circuit 440 equally. That is to say, the adjusting circuit 470 does not adjust operation of the receiving circuit 440.

When the detecting circuit 460 detects a positive DC offset voltage (e.g., VDC1>VDC2), the first voltage Voff+ exceeds the second voltage Voff−. This causes the third NMOS transistor N3 to turn on more than the fourth NMOS transistor N4. This results in less current being driven into the driven side 444 by the drive side 442, and the data signal will be held at a low voltage for a longer period of time than if no adjustment had taken place. Stated another way, the quantity of current flowing through the third NMOS transistor N3 is greater than the quantity of the current flowing through the fourth NMOS transistor N4, and the low interval of the data signal increases. This effectively reduces the DC offset voltage reflected in the data signal. For example, FIGS. 3C and 3E illustrate two cases where a positive DC offset voltage is detected. As shown, the DC offset voltage is reflected in the greater than 50% duty ratio of the resulting data signal shown in FIGS. 3D and 3F, respectively. The adjusting circuit 470, in response to the first and second voltage Voff+ and Voff−, decreases the impact on the data signal by adjusting the duty ratio toward 50%.

When the detecting circuit 460 detects a negative DC offset voltage (e.g., VDC2>VDC1), the second voltage Voff− exceeds the first voltage Voff+. This causes the fourth NMOS transistor N4 to turn on more than the third NMOS transistor N3. This results in more current being driven into the driven side 444 by the drive side 442, and the data signal will be held at a high voltage for a longer period of time than if no adjustment had taken place. This effectively reduces the negative DC offset voltage reflected in the data signal. For example, the negative DC offset voltage is reflected in a less than 50% duty ratio of the resulting data signal. The adjusting circuit 470, in response to the first and second voltage Voff+ and Voff−, decreases the impact on the data signal by adjusting the duty ratio toward 50%.

As demonstrated above, the adjusting circuit 470, in response to the DC offset voltage detected by the detecting circuit 460, reduces the magnitude of the DC offset voltage as reflected in the data signal. Furthermore, this adjustment causes the data signal to converge towards a 50% duty cycle.

Figure 8:
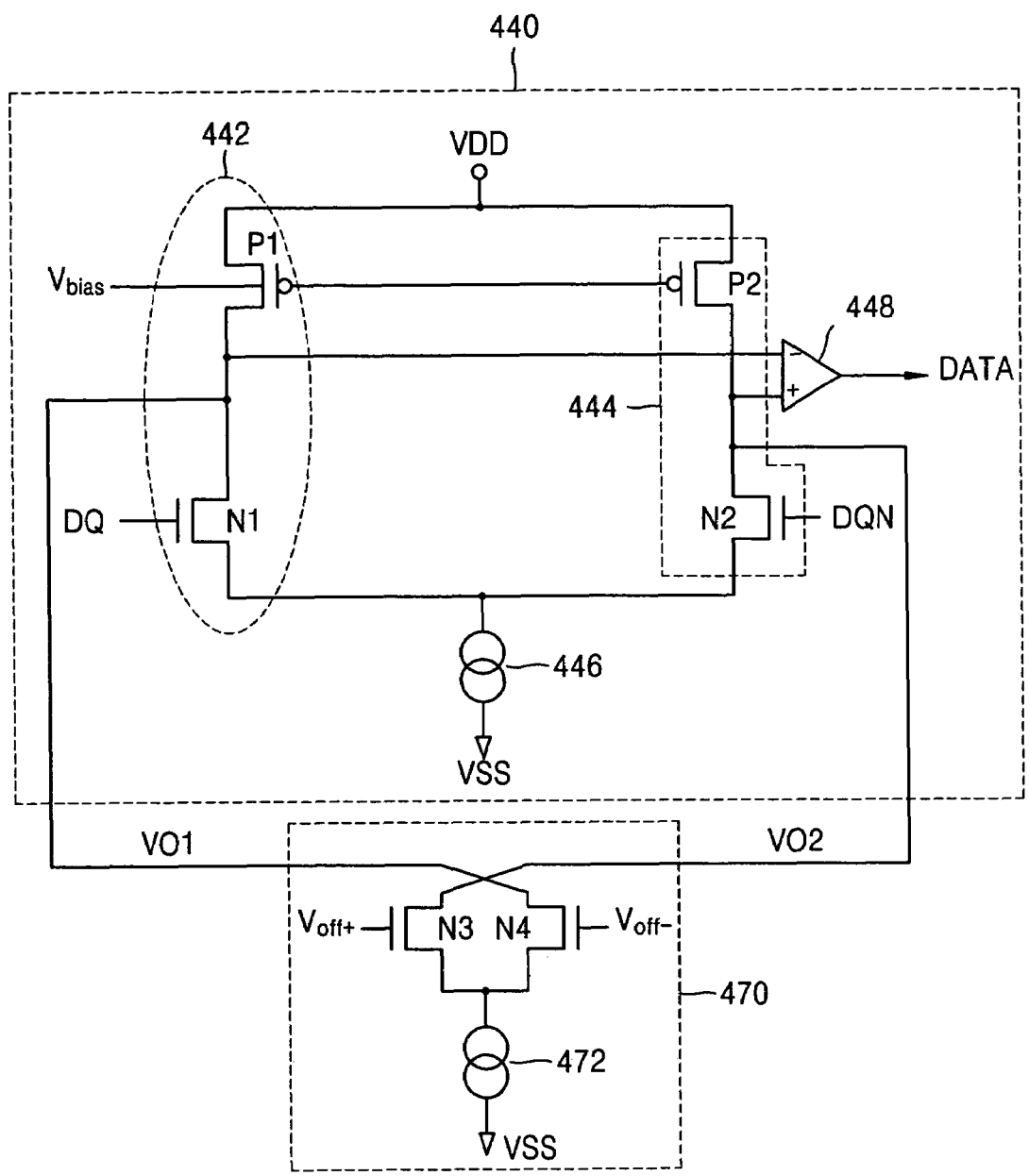
FIG. 8 illustrates the receiving circuit of FIG. 4 according to a second embodiment of the present invention.

FIG. 8 illustrates a receiving circuit 440 according to a second embodiment of the present invention. The receiving circuit 440 of this second embodiment is the same as the receiving circuit of the first embodiment shown in FIG. 7, except for the addition of a differential amplifier 448 and a bias Vbias applied to the gates of the first and second PMOS transistors P1 and P2. A positive input of the differential amplifier 448 is connected to the connection between the second PMOS transistor P2 and the second NMOS transistor N2. A negative input of the differential amplifier 448 is connected to the connection between the first PMOS transistor P1 and the first NMOS transistor N1. The output of the differential amplifier 448 serves as the output of the receiving circuit 440; and therefore, produces the data signal. Except for the data signal being the result of an amplified comparison of the two voltages at the positive and negative inputs of the differential amplifier 448, the operation of the receiving circuit 440 and operation of the adjusting circuit 470 are the same as described above with respect to FIG. 7.

Figure 9:
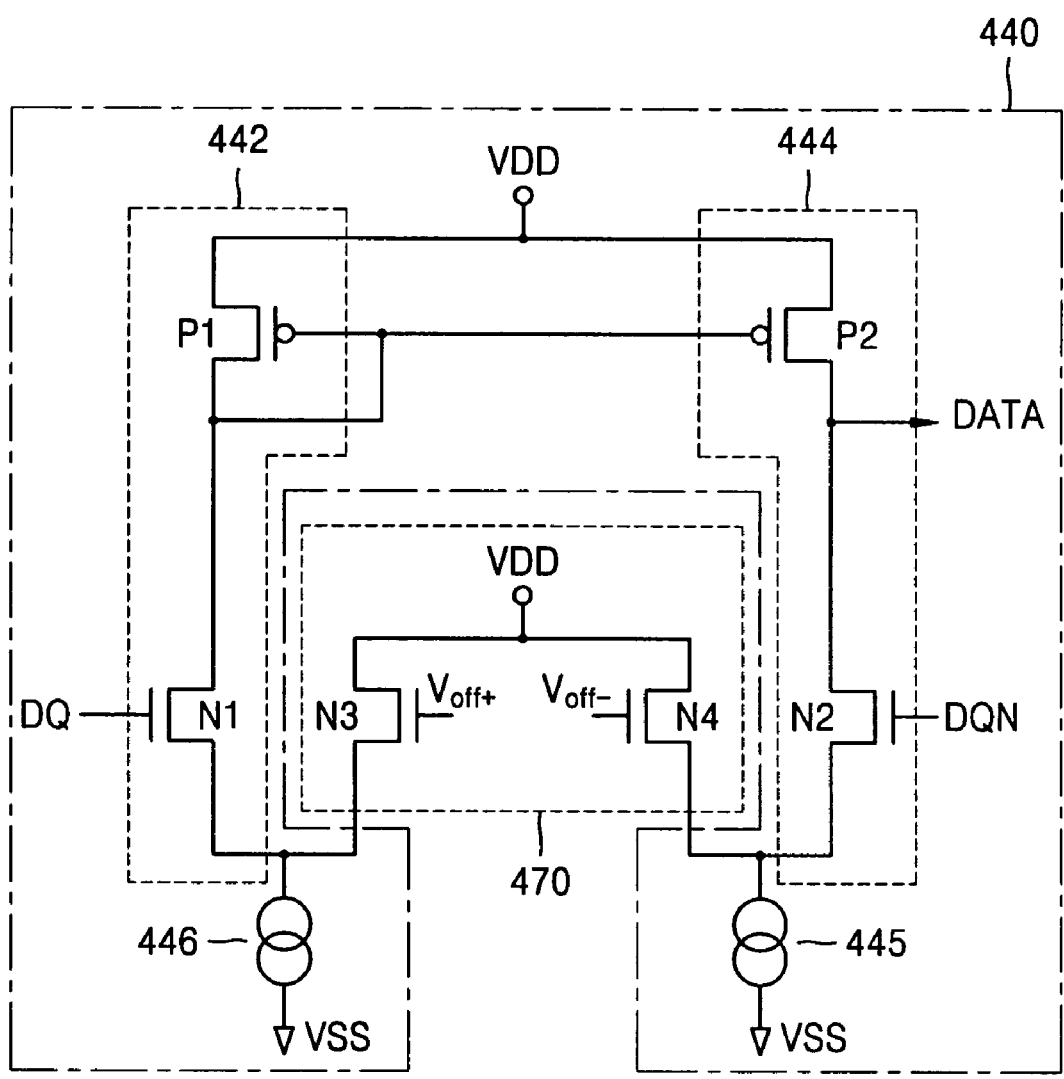
FIG. 9 illustrates another embodiment of the receiving circuit and another embodiment of the adjusting circuit of FIG. 4 according to the present invention.

FIG. 9 illustrates another embodiment of the receiving circuit 440 and another embodiment of the adjusting circuit 470 according to the present invention. The receiving circuit 440 is the same as the receiving circuit shown in FIG. 7, except that the second NMOS transistor N2 is connected to a constant current source 445 and not the constant current source 446. The constant current source 445 is connected to ground VSS.

The adjusting circuit 470 of the embodiment shown in FIG. 9 is the same as the embodiment of FIG. 7, except that the constant current source 472 has been eliminated. Namely, this embodiment includes the third NMOS transistor N3 connected between the supply voltage VDD and the constant current source 446, and the fourth NMOS transistor connected between the supply voltage VDD and the constant current source 445.

While the above described structural differences exist between the embodiment of FIG. 9 and that of FIG. 7, the operation of the receiving circuit 440 and adjusting circuit 470 are similar with respect to FIG. 7. Assuming no DC offset voltage, the quantity of current flowing through the third transistor N3 of adjusting circuit 470 is the same as that of current flowing through the fourth transistor N4 of adjusting circuit 470. However, when a pair of differential data signals DQ/DQN have a positive offset voltage, the quantity of current flowing through the transistor N3 is greater than that of current flowing the transistor N4 such that the quantity of current flowing in drive side 442 is reduced while the quantity of current flowing in driven side 444 is increased compared to the case of no offset voltage. Therefore, this results in less current being driven into the driven side 444 by the drive side 442. Accordingly, the data signal DATA is held at a low voltage for a longer period of time than if no adjustment had taken place such that the duty ratio of the data signal DATA may be adjusted to the normal duty range 50%.

Figure 10:
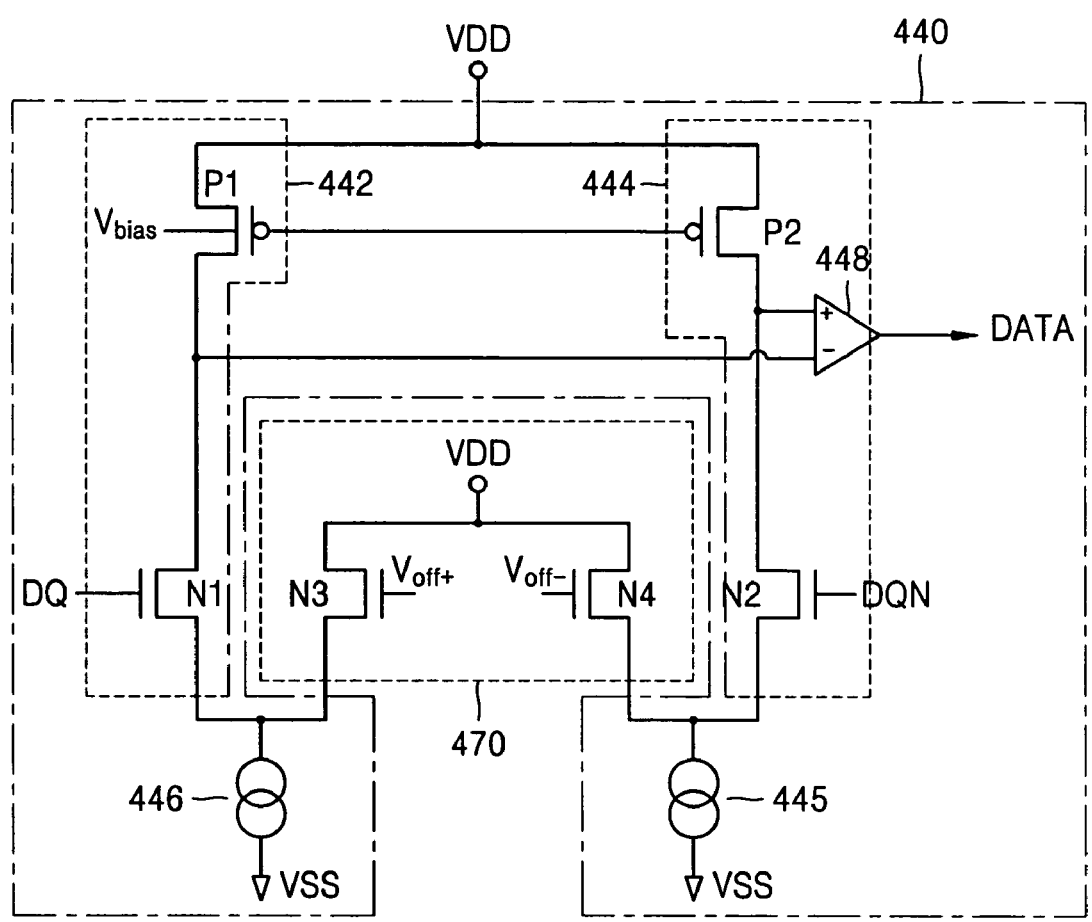
FIG. 10 illustrates yet another embodiment of the receiving circuit and the adjusting circuit of FIG. 4 according to the present invention.

FIG. 10 illustrates a receiving circuit 440 and adjusting circuit 470 according to yet another embodiment of the present invention. The receiving circuit 440 and adjusting circuit 470 of this embodiment are the same as in the embodiment shown in FIG. 9, except for the addition of a differential amplifier 448 and a bias Vbias applied to the gates of the first and second PMOS transistors P1 and P2. A positive input of the differential amplifier 448 is connected to the connection between the second PMOS transistor P2 and the second NMOS transistor N2. A negative input of the differential amplifier 448 is connected to the connection between the first PMOS transistor P1 and the first NMOS transistor N1. The output of the differential amplifier 448 serves as the output of the receiving circuit 440; and therefore, produces the data signal. Except for the data signal being the result of an amplified comparison of the two voltages at the positive and negative inputs of the differential amplifier 448, the operation of the receiving circuit 440 and operation of the adjusting circuit 470 are the same as described above with respect to FIG. 9.

Figure 11:
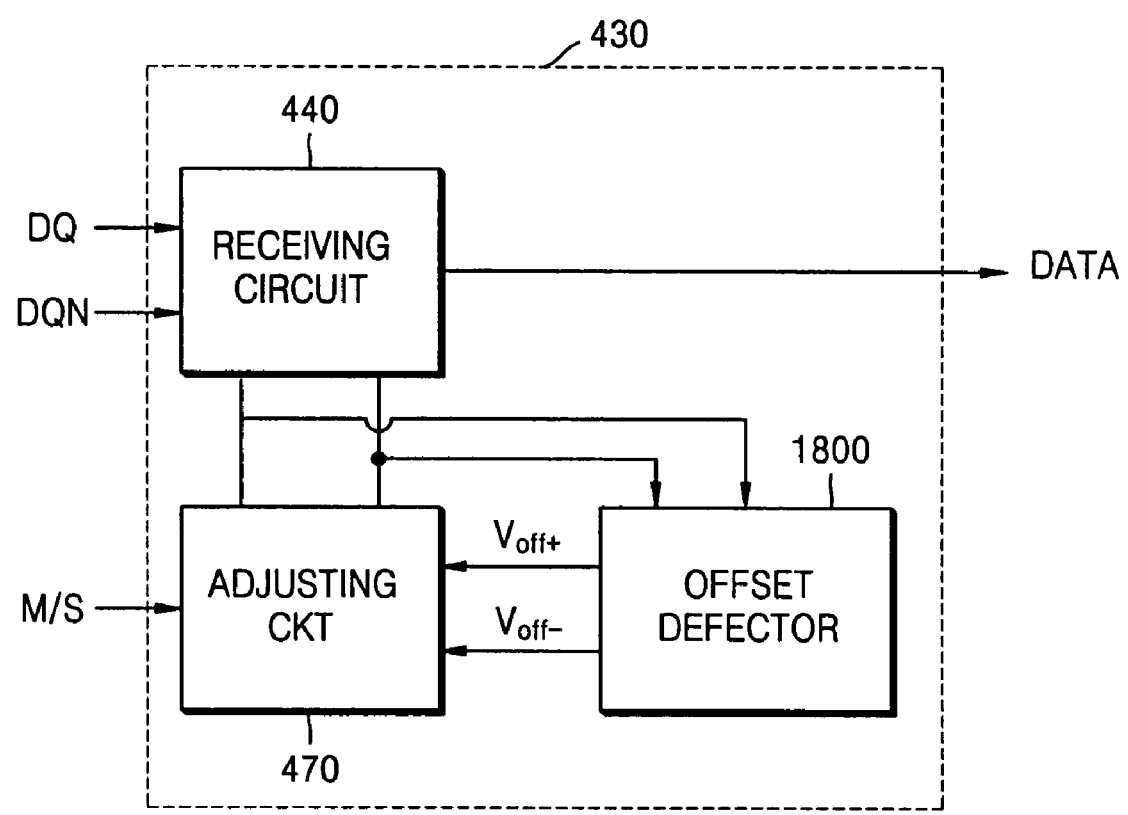
FIG. 11 illustrates a second embodiment of the input circuit according to the present invention.

FIG. 11 illustrates a second embodiment of the input circuit 430 according to the present invention. The input circuit of FIG. 11 is the same as the input circuit of FIG. 4, except that the offset detector 460 has been replaced by an offset detector 1800 and the offset detector 1800 receives the first and second adjusting voltages VO1 and VO2 instead of the generated data signal. Accordingly, except for the operation and structure of the detecting circuit 1800, the input circuit of FIG. 11 operates the same as the input circuit of FIG. 4. For the sake of brevity, therefore, only these structural and operational differences will be described in detail.

Figure 12:
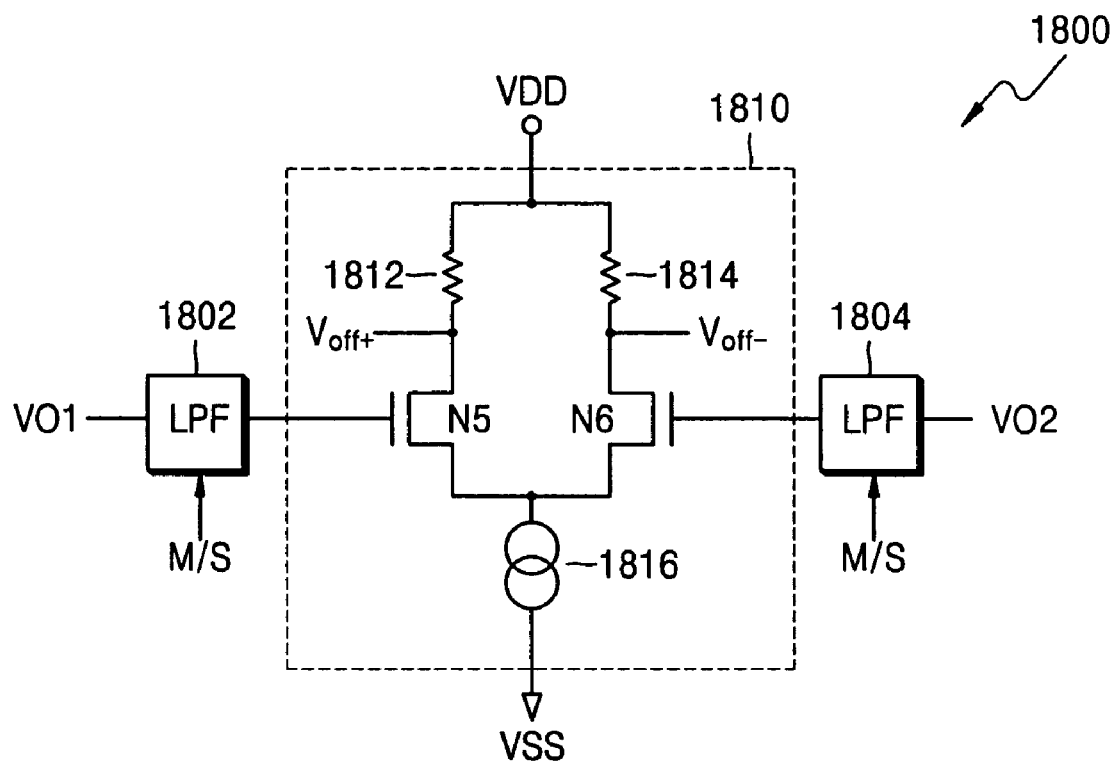
FIG. 12 illustrates an embodiment of the detecting circuit in the input circuit of FIG. 11.

FIG. 12 illustrates an embodiment of the detecting circuit 1800. As shown, a first low pass filter 1802 receives and selectively low pass filters the first adjusting voltage VO1 to generate a DC voltage of the first adjusting voltage VO1. A second low pass filter 1804 receives and selectively low pass filters the second adjusting voltage VO2 to generate a DC voltage of the second adjusting voltage VO2. Both the first and second low pass filters 1802 and 1804 selectively operate in response to the mode signal M/S. When the mode signal M/S indicates the test mode, the first and second low pass filters 1802 and 1804 perform their respective filtering operations. However, when the mode signal M/S indicates the normal mode, the first and second low pass filters 1802 and 1804 do not operate.

Figure 13A:
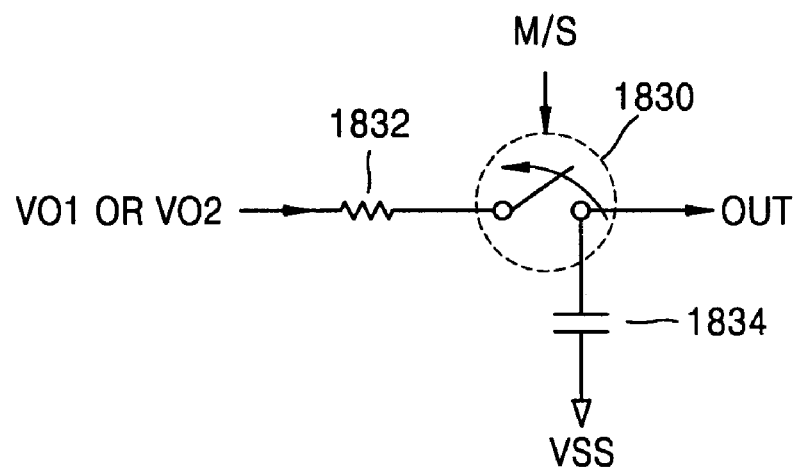
FIGS. 13A and 13B each illustrate embodiments of the low pass filters in the detecting circuit of FIG. 12.

FIG. 13A illustrates an example embodiment of the first and second low pass filters 1802 and 1804. As shown, the first or second adjusting voltage VO1 or VO2 is supplied to a switch 1830 via a resistor 1832. The switch 1830 selectively supplies the adjusting voltage VO1 or VO2 as output based on the mode signal M/S. A capacitor 1834 is connected between the output and ground VSS. Accordingly, when the switch 1830 supplies the adjusting voltage VO1 or VO2 to the output, the resistor 1832 and capacitor 1834 perform a well-known low pass filtering operation such that the DC voltage of the adjusting voltage VO1 or VO2 is supplied as the output of the low pass filter 1802 or 1804. When the mode signal M/S indicates the test mode, the switch 1830 supplies the adjusting voltage VO1 or VO2 to output, and when the mode signal M/S indicates the normal mode, the switch does not supply the adjusting voltage VO1 or VO2 to the capacitor 1834.

Figure 13B:
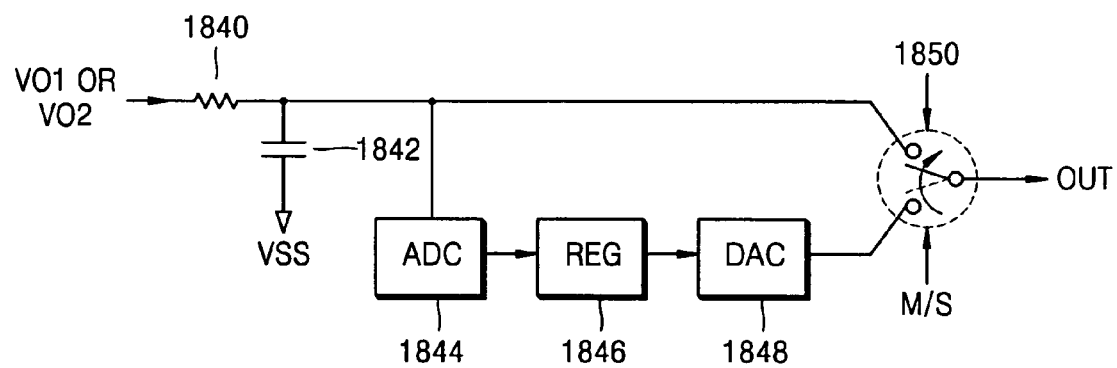

FIG. 13B illustrates another example embodiment of the first and second low pass filters 1802 and 1804. As shown, the differential data signal DQ or DQN is supplied to a switch 1850 via a resistor 1840. A capacitor 1842 is connected between the output of the resistor 1840 and ground VSS. Accordingly, as is well known, the resistor 1840 and capacitor 1842 are filtering the high frequency components of the adjusting voltage VO1 or VO2. A analog-to-digital converter (ADC) 1844 also receives the filtered adjusting voltage VO1 or VO2, and converts the filtered adjusting voltage VO1 or VO2 to digital. A register 1846 stores the digital output from the ADC 1844, and a digital-to-analog converter (DAC) 1848 converts the output of the register 1846 to analog. The switch 1850 selectively outputs one of the filtered adjusting voltage VO1 or VO2 and the output from the DAC 1848 in response to the mode signal M/S. In the test mode, the switch 1850 selects the filtered adjusting voltage VO1 or VO2. In the normal mode, the switch 1850 selects the output of the DAC 1848.

Returning to FIG. 12, the detecting circuit 1800 further includes a differential amplifier 1810. As shown, the differential amplifier 1810 includes a resistor 1812 and a fifth NMOS transistor N5 connected in series between the power supply voltage VDD and a constant current source 1816. Another resistor 1814 and a sixth NMOS transistor N6 are also connected in series between the power supply voltage VDD and the constant current source 1816. The constant current source is connected to ground VSS.

The gate of the fifth NMOS transistor N5 receives the output of the first low pass filter 1802, and the gate of the sixth NMOS transistor N6 receives the output of the second low pass filter 1804. The connection between the resistor 1812 and the fifth NMOS transistor N5 supplies the first voltage Voff+, and the connection between the resistor 1814 and the sixth NMOS transistor N6 supplies the second voltage Voff−.

In operation, when a positive DC offset exists (e.g., VDC1>VDC2), the DC voltage of the first adjusting voltage VO1 will be less than the DC voltage of the second adjusting voltage VO2. As a result, the fifth NMOS transistor N5 turns on for a shorter period of time than the sixth NMOS transistor N6, and the first voltage Voff+ will be greater than the second voltage Voff−. When, a negative DC offset exits (e.g., VDC2>VDC1), the DC voltage of the second adjusting voltage VO2 will be less than the DC voltage of the first adjusting voltage VO1. As a result, the sixth NMOS transistor N6 turns on for a shorter period of time than the fifth NMOS transistor N5, and the second voltage Voff− will be greater than the first voltage Voff+. When, no DC offset voltage exists, the first and second voltages Voff+ and Voff− will be equal because the first and second adjusting voltages will have the same DC voltage.

It will also be understood that the embodiment of FIG. 11 is not limited to the receiving circuit 440 and adjusting circuit 470 of FIG. 4. Instead, the receiving circuit 440 and adjusting circuit 470 of any of the above described embodiments may be used in the embodiment of FIG. 11.

Figure 14:
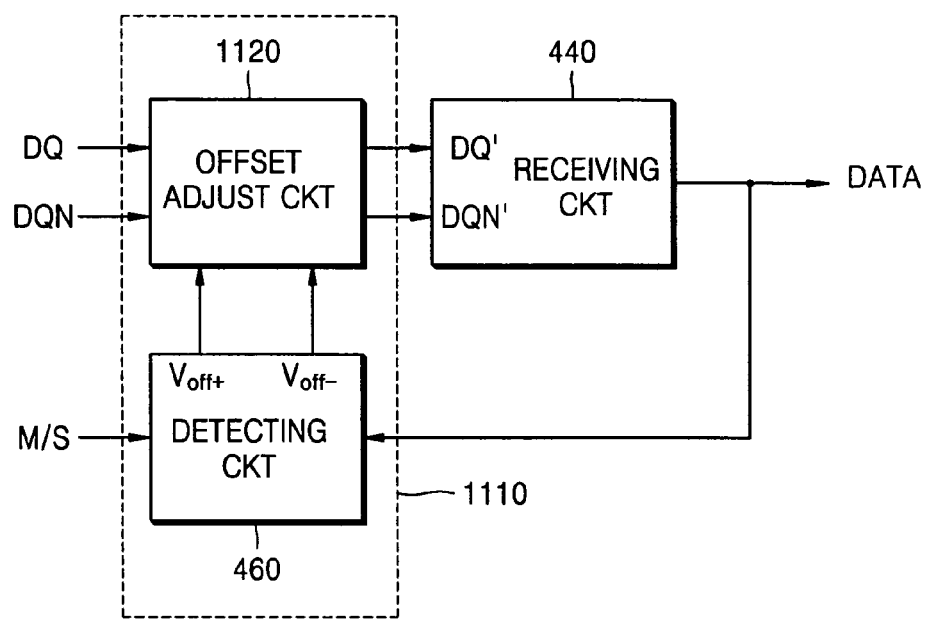
FIG. 14 illustrates an input circuit according to a further embodiment of the present invention.

FIG. 14 illustrates an input circuit 430 according to a further embodiment of the present invention. In this embodiment, an adjusting circuit 1110 receives the pair of differential data signals DQ and DQN as well as the mode signal M/S, and selectively generates a pair of adjusted differential data signals DQ' and DQN'. The receiving circuit 440 generates the data signal based on the pair of adjusted differential data signals DQ' and DQN'. More specifically, the adjusting circuit 1110 includes the detecting circuit 460 and an offset adjust circuit 1120. As described previously above, the detecting circuit 460 selectively detects the DC offset voltage between the pair of differential data signals based on the data signal, and generates the first and second voltages Voff+ and Voff− indicative of this DC offset voltage. As will be appreciated from the following description, the first and second voltages Voff+ and Voff− more particularly represent the DC offset voltage between the pair of adjust differential data signals DQ' and DQN'.

Figure 15:
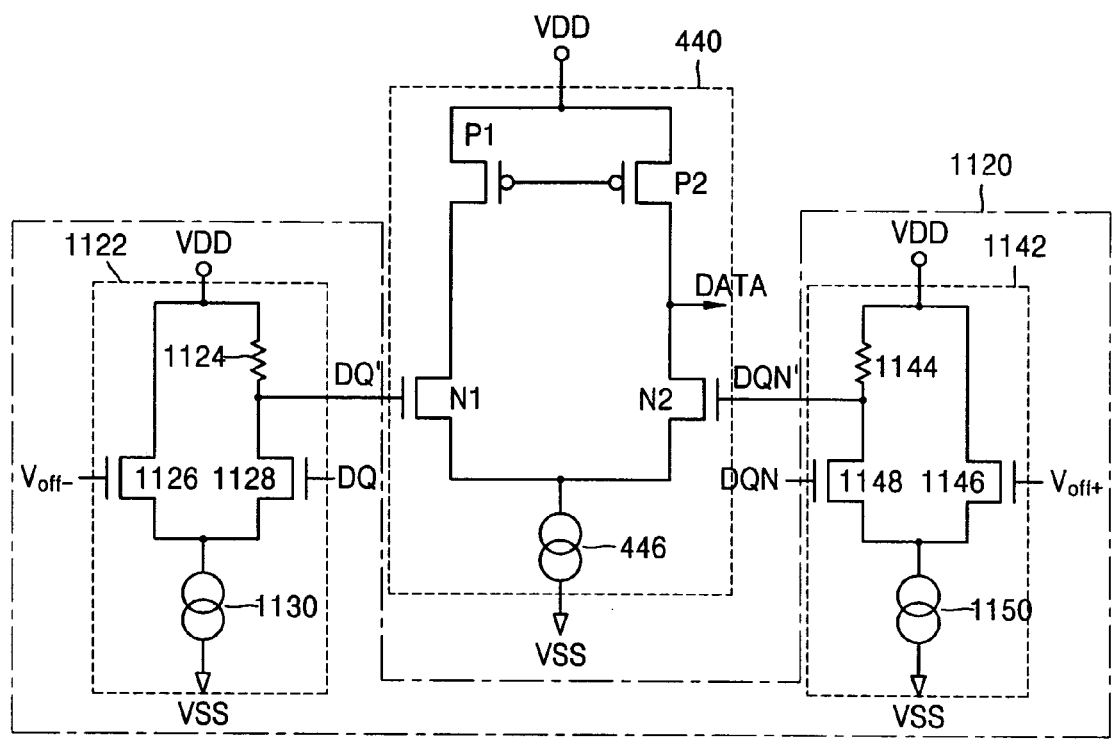
FIG. 15 illustrates an embodiment of the offset adjust circuit in FIG. 14.

FIG. 15 illustrates an embodiment of the offset adjust circuit 1120 and the connection thereof to the receiving circuit 440. As shown, the offset adjust circuit 1120 includes a first comparator 1122 and a second comparator 1142. The first comparator 1122 includes a an NMOS transistor 1126 connected between the supply voltage VDD and a constant current source 1130. The first comparator 1122 further includes a resistor 1124 connected in series with another NMOS transistor 1128 between the supply voltage VDD and the constant current source 1130. The constant current source 1130 is connected to ground VSS. The second voltage Voff− is supplied to the gate of the NMOS transistor 1126, and the first differential data signal DQ is supplied to the gate of the NMOS transistor 1128. The connection between the resistor 1124 and the NMOS transistor 1128 serves as the output of the first comparator 1122, and produces the first adjusted differential data signal DQ'.

The second comparator 1142 includes an NMOS transistor 1146 connected between the supply voltage VDD and a constant current source 1150. The second comparator 1142 further includes a resistor 1144 connected in series with another NMOS transistor 1148 between the supply voltage VDD and the constant current source 1150. The constant current source 1150 is connected to ground VSS. The first voltage Voff+ is supplied to the gate of the NMOS transistor 1146, and the second differential data signal DQN is supplied to the gate of the NMOS transistor 1148. The connection between the resistor 1144 and the NMOS transistor 1148 serves as the output of the second comparator 1142, and produces the second adjusted differential data signal DQN'.

In operation, when a positive DC offset exists (e.g., VDC1>VDC2), the first voltage Voff+ and the first differential data signal DQ will, over several periods of the test signal, be greater than the second voltage Voff− and the second differential data signal DQN. As a result, in the first comparator 1122, when the value of the first differential data signal DQ is high level, the value of the first adjusted differential data signal DQ' is relatively decreased compared to if no offset voltage (Voff+=Voff−) exists. This is because the quantity of current flowing through NMOS transistor 1126 is less than the quantity of current flowing through NMOS transistor 1126 if offset voltage does not exist. Therefore, the quantity of current flowing through NMOS transistor 1128 when the first differential data signal DQ has a high level is relatively increased compared to if no offset voltage (Voff+=Voff−) exists such that a high voltage value of the adjusted first differential data signal DQ' is decreased compared to if no offset voltage exists. This results in less current being driven into the driven side 444 by the drive side 442.

Accordingly, the data signal DATA is held at high voltage for a shorter period of time than if no adjustment had taken place. Also, in the second comparator 1142, when the value of the second differential data signal DQN is high level, the value of the second adjusted differential data signal DQN' is relatively increased compared to if no offset voltage (Voff+=Voff−) exists. This is because the quantity of current flowing through NMOS transistor 1146 is greater than the quantity of current flowing through NMOS transistor 1146 if an offset voltage does not exist. Therefore, the quantity of current flowing through NMOS transistor 1148 when the second differential data signal DQN has a high level is relatively decreased compared to if no offset voltage (Voff+=Voff−) exists such that a high voltage value of the adjusted second differential data signal DQN' is increased compared to if no offset voltage exists. This results in greater current being driven into the constant current source 446 by NMOS transistor N2.

Accordingly, the data signal DATA is held at low voltage for a longer period of time than if no adjustment had taken place. As will be appreciated, this reduces the DC offset voltage between the adjusted differential data signals DQ' and DQN' as compared to the differential data signals. And, the duty ratio of the data signal will converge towards 50%.

When, a negative DC offset exits (e.g., VDC2>VDC1), the second voltage Voff− and the second differential data signal DQN will, over several periods of the test signal, be greater than the first voltage Voff+ and the first differential data signal DQ. As a result, in the first comparator 1122, when the value of the first differential data signal DQ is high level, the value of the first adjusted differential data signal DQ' is relatively increased compared to if no offset voltage (Voff+=Voff−) exists. This is because the quantity of current flowing through NMOS transistor 1126 is greater than the quantity of current flowing through NMOS transistor 1126 when an offset voltage does not exist. Therefore, the quantity of current flowing through NMOS transistor 1128 when the first differential data signal DQ has a high level is relatively decreased compared to if no offset voltage (Voff+=Voff−) exists such that a high voltage value of the first adjusted differential data signal DQ' is increased compared to if no offset voltage exists. This results in greater current being driven into the driven side 444 by the drive side 442.

Accordingly, the data signal DATA is held at high voltage for a longer period of time than if no adjustment had taken place. In the second comparator 1142, when the value of the second differential data signal DQN is a high level, the value of the second adjusted differential data signal DQN' is relatively decreased compared to if no offset voltage (Voff+=Voff−) exists. This is because the quantity of current flowing through NMOS transistor 1146 is less than the quantity of current flowing through NMOS transistor 1146 when an offset voltage does not exist. Therefore, the quantity of current flowing through NMOS transistor 1148 when the second differential data signal DQN has high level is relatively increased compared to if no offset voltage (Voff+=Voff−) exists such that a high voltage value of DQN' is decreased compared to if no offset voltage exists. This results in less current being driven into a constant current source 446 by the NMOS transistor N2.

Accordingly, the data signal DATA is held at low voltage for a shorter period of time than if no adjustment had taken place. As will be appreciated, this reduces the magnitude of the DC offset voltage between the adjusted differential data signals DQ' and DQN' as compared to the differential data signals. And, the duty ratio of the data signal DATA will converge towards 50%.

It will also be understood that the embodiment of FIG. 14 is not limited to the receiving circuit 440 of FIG. 4. Instead, the receiving circuit 440 of any of the above described embodiments may be used in the embodiment of FIG. 14.

Figure 16:
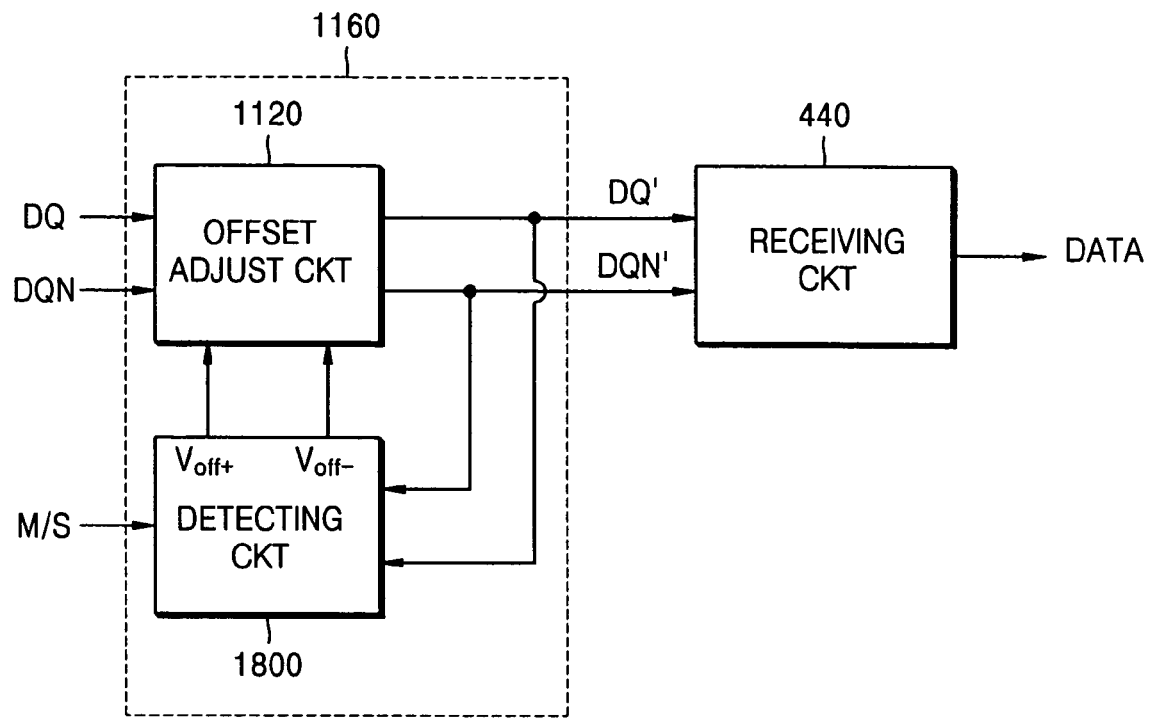
FIG. 16 illustrates an input circuit according to a still further embodiment of the present invention.

FIG. 16 illustrates an input circuit 430 according to a still further embodiment of the present invention. In this embodiment, an adjusting circuit 1160 receives the pair of differential data signals DQ and DQN as well as the mode signal M/S, and selectively generates a pair of adjusted differential data signals DQ' and DQN'. The receiving circuit 440 generates the data signal based on the pair of adjusted differential data signals DQ' and DQN'. More specifically, the adjusting circuit 1160 includes the detecting circuit 1800 (described in detail above with respect to FIG. 12) and an offset adjust circuit 1120 (described in detail above with respect to FIG. 15). As described previously above, the detecting circuit 1800 selectively detects the DC offset voltage between the pair of differential data signals based on first and second adjusting voltages VO1 and VO2. In this embodiment, the first and second adjusted differential data signals DQ' and DQN' replace the first and second adjusting voltage VO1 and VO2, respectively. Based thereon, and in the same manner described above, the detecting circuit 1800 generates the first and second voltages Voff+ and Voff− indicative of this DC offset voltage. As will be appreciated from the following description, the first and second voltages Voff+ and Voff− more particularly represent the DC offset voltage between the pair of adjust differential data signals DQ' and DQN'.

The offset adjust circuit 1120 and the receiving circuit 440 then operate in the same manner as discussed previously above. Furthermore, it will also be understood that the embodiment of FIG. 16 is not limited to the receiving circuit 440 of FIG. 4. Instead, the receiving circuit 440 of any of the above described embodiments may be used in the embodiment of FIG. 16.

Figure 17:
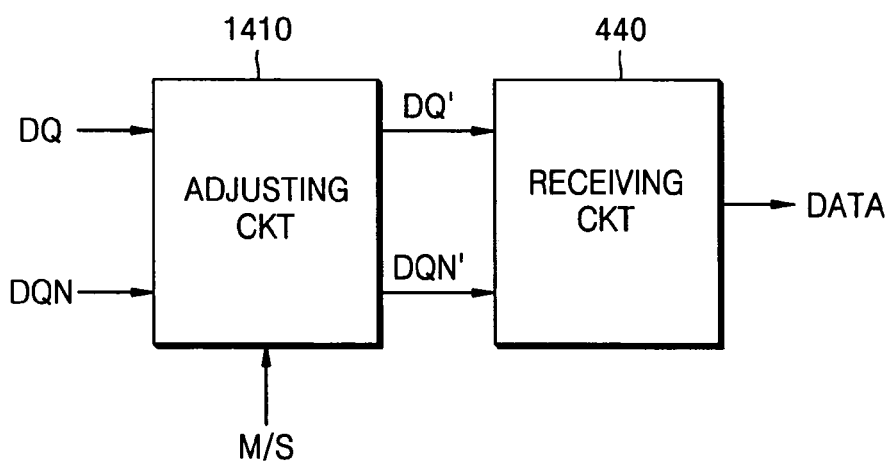
FIG. 17 illustrates an input circuit according to an additional embodiment of the present invention.

FIG. 17 illustrates an input circuit 430 according to an additional embodiment of the present invention. In this embodiment, an adjusting circuit 1410 receives the pair of differential data signals DQ and DQN as well as the mode signal M/S, and selectively generates a pair of adjusted differential data signals DQ' and DQN'. The receiving circuit 440 generates the data signal based on the pair of adjusted differential data signals DQ' and DQN'.

Figure 18:
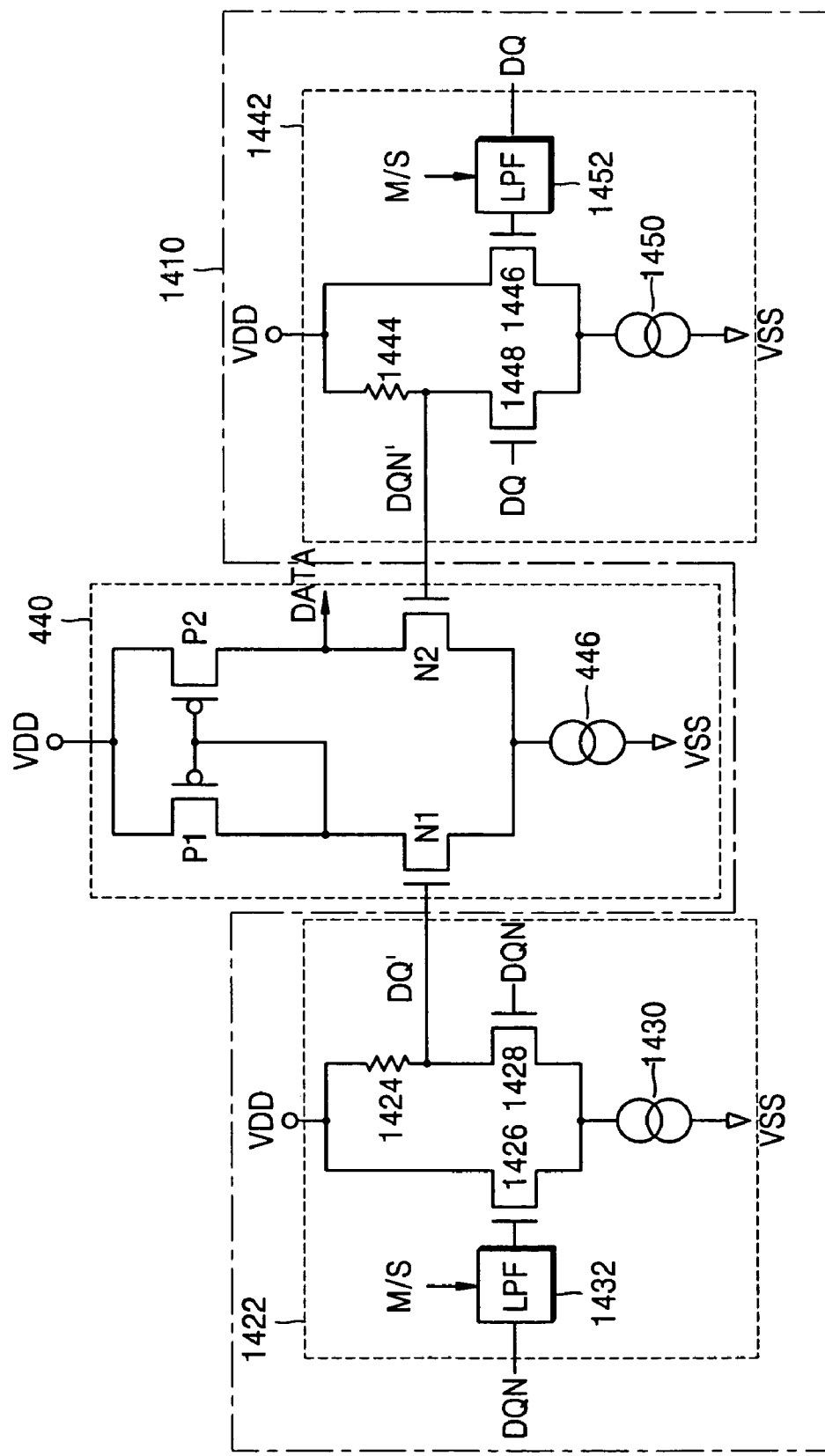
FIG. 18 illustrates an embodiment of the adjusting circuit in FIG. 17.

FIG. 18 illustrates an embodiment of the adjusting circuit 1410 and the connection thereof to the receiving circuit 440. As shown, the adjusting circuit 1410 includes a first comparator 1422 and a second comparator 1442. The first comparator 1422 includes a an NMOS transistor 1426 connected between the supply voltage VDD and a constant current source 1430. The first comparator 1422 further includes a resistor 1424 connected in series with another NMOS transistor 1428 between the supply voltage VDD and the constant current source 1430. The constant current source 1430 is connected to ground VSS. The second differential data signal DQN is supplied to the gate of the NMOS transistor 1426 via a first low pass filter 1432 and the gate of the NMOS transistor 1428. The first low pass filter 1432 may have the structure and operate as discussed above with respect to either FIG. 13A or FIG. 13B. The connection between the resistor 1424 and the NMOS transistor 1428 serves as the output of the first comparator 1422, and produces the first adjusted differential data signal DQ'.

The second comparator 1442 includes an NMOS transistor 1446 connected between the supply voltage VDD and a constant current source 1450. The second comparator 1442 further includes a resistor 1444 connected in series with another NMOS transistor 1448 between the supply voltage VDD and the constant current source 1450. The constant current source 1450 is connected to ground VSS. The first differential data signal DQ is supplied to the gate of the NMOS transistor 1448 and the gate of the NMOS transistor 1446 via a second low pass filter 1452 The second low pass filter 1452 may have the structure and operate as discussed above with respect to either FIG. 13A or FIG. 13B. The connection between the resistor 1444 and the NMOS transistor 1448 serves as the output of the second comparator 1442, and produces the second adjusted differential data signal DQN'.

In operation, when a positive DC offset exists (e.g., VDC1>VDC2), the filtered first differential data signal (VDC1) will, over several periods of the test signal, be greater than the filtered second differential data signal (VDC2). As a result, in the first comparator 1422, when the value of the second differential data signal DQN is a high level, the value of the first adjusted differential data signal DQ' is relatively decreased compared to if no offset voltage (VDC1=VDC2) exists. This is because the quantity of current flowing through NMOS transistor 1426 is less than when an offset voltage does not exist. Therefore, the quantity of current flowing through NMOS transistor 1428 when the second differential data signal DQN has a high level is relatively increased compared to if no offset voltage exists such that a high voltage value of the first adjusted differential data signal DQ' is further decreased. This results in less current being driven into the driven side 444 by the drive side 442. Accordingly, the data signal DATA is held at high voltage for a shorter period of time than if no adjustment had taken place.

In the second comparator 1442, when the value of the first differential data signal DQ is a high level, the value of the second adjusted differential data signal DQN' is relatively increased compared to if no offset voltage exists. This is because the quantity of current flowing through NMOS transistor 1446 is greater than the quantity of current flowing through NMOS transistor 1446 when an offset voltage does not exist. Therefore, the quantity of current flowing through NMOS transistor 1448 when the first differential data signal DQ has a high level is relatively decreased compared to if no offset voltage exists such that a high voltage value of the adjusted second differential data signal DQN' is further increased. This results in greater current being driven into the constant current source 446 by the NMOS transistor N2.

Accordingly, the data signal DATA is held at low voltage for a longer period of time than if no adjustment had taken place. As will be appreciated, this reduces the DC offset voltage between the adjusted differential data signals DQ' and DQN' as compared to the differential data signals. And, the duty ratio of the data signal will converge towards 50%.

When, a negative DC offset exits (e.g., VDC2>VDC1), the filtered second differential data signal (VDC2) will, over several periods of the test signal, be greater than the filtered first differential data signal (VDC1). As a result, in the first comparator 1422, when the value of the second differential data signal DQN is a high level, the value of the first adjusted differential data signal DQ' is relatively increased compared to if no offset voltage (VDC1=VDC2) exists. This is because the quantity of current flowing through NMOS transistor 1426 is greater than when an offset voltage does not exist. Therefore, the quantity of current flowing through NMOS transistor 1428 when the second differential data signal DQN has a high level is relatively decreased compared to if no offset voltage exists such that a high voltage value of DQ' is further increased. This results in greater current being driven into the driven side 444 by the drive side 442. Accordingly, the data signal DATA is held at high voltage for a longer period of time than if no adjustment had taken place.

In the second comparator 1442, when the value of the first differential data signal DQ is a high level, the value of the second adjusted differential data signal DQN' is relatively decreased compared to if no offset voltage exists. This is because the quantity of current flowing through NMOS transistor 1446 is less than the quantity of current flowing through NMOS transistor 1446 when an offset voltage does not exist. Therefore, the quantity of current flowing through NMOS transistor 1448 when DQ has high level is relatively increased compared to if no offset voltage exists such that a high voltage value of the second differential data signal DQN' is further decreased. This results in less current being driven into the constant current source 446 by the NMOS transistor N2.

Accordingly, the data signal DATA is held at low voltage for a shorter period of time than if no adjustment had taken place. As will be appreciated, this reduces the magnitude of the DC offset voltage between the adjusted differential data signals DQ' and DQN' as compared to the differential data signals. And, the duty ratio of the data signal will converge towards 50%.

It will also be understood that the embodiment of FIG. 18 is not limited to the receiving circuit 440 of FIG. 4. Instead, the receiving circuit 440 of any of the above described embodiments may be used in the embodiment of FIG. 14.

The invention being thus described, it will be obvious that the same may be varied in many ways. For example, while the memory system examples given above have been for a memory module including a plurality of memory devices. Instead of a memory module, a single memory device may receive the differential data signals. Such variations are not to be regarded as a departure from the invention, and all such modifications are intended to be included within the scope of the invention.

We claim:

1. An input circuit, comprising:
   a receiver circuit generating a data signal based on a pair of differential data signals;
   a detecting circuit detecting an offset voltage between the pair of differential data signals; and
   an adjusting circuit adjusting operation of the receiver to reduce a magnitude of the offset voltage based on the detected offset voltage.

2. The input circuit of claim 1, wherein the adjusting circuit adjusts the operation of the receiver such that a duty ratio of the data signal converges towards a 50% duty ratio.

3. The input circuit of claim 1, wherein the detecting circuit detects the offset voltage only during a test mode of the input circuit.

4. The input circuit of claim 1, wherein the detecting circuit detects the offset voltage based on the generated data signal.

5. The input circuit of claim 4, wherein the detecting circuit compares the generated data signal to a reference voltage to detect the offset voltage.

6. The input circuit of claim 5, wherein the detecting circuit generates first and second voltages representing the detected offset voltage based on the comparison.

7. The input circuit of claim 6, wherein the detecting circuit generates the first and second voltages such that the first voltage increases with respect to the reference voltage as the generated data signal exceeds the reference voltage and the second voltage decreases with respect to the reference voltage as the generated data signal exceeds the reference voltage.

8. The input circuit of claim 6, wherein the adjusting circuit adjusts the operation of the receiver based on the first and second voltages.

9. The input circuit of claim 8, wherein
   the receiver circuit includes a current mirror having a drive side and a driven side, the drive side having an input receiving a first of the pair of differential data signals, and the driven side having an input receiving a second of the pair of differential data signals; and
   the adjusting circuit selectively pulls more current from one of the drive side and the driven side based on the first and second voltages.

10. The input circuit of claim 9, wherein
    the detecting circuit generates the first voltage to be greater than the second voltage when the detected offset is positive; and
    the adjusting circuit pulls more current from the driven side when the first voltage is greater than the second voltage.

11. The input circuit of claim 9, wherein
    the detecting circuit generates the second voltage to be greater than the first voltage when the detected offset is negative;
    the adjusting circuit pulls more current from the drive side when the second voltage is greater than the first voltage.

12. The input circuit of claim 8, wherein the receiver includes a differential amplifier having a first input connected to the drive side and second input connected to the driven side, and having an output producing the generated data signal.

13. The input circuit of claim 1, wherein
    the receiver circuit includes a current mirror having a drive side and a driven side, the drive side having an input receiving a first of the pair of differential data signals, and the driven side having an input receiving a second of the pair of differential data signals; and
    the adjusting circuit selectively pulls more current from one of the drive side and the driven side based on the detected offset voltage.

14. The input circuit of claim 9, wherein the receiver circuit includes a differential amplifier having a first input connected to the drive side and second input connected to the driven side, and the differential amplifier producing the generated data signal in response to the first and second output signals.

15. The input circuit of claim 9, wherein the adjusting circuit includes a first transistor connected to the driven side and receiving the first voltage, and a second transistor connected to the drive side and receiving the second voltage.

16. The input circuit of claim 1, wherein
    the receiver circuit includes a first current mirror having a drive side and a driven side, the drive side having an input receiving a first of the pair of differential data signals, and the driven side having an input receiving a second of the pair of differential data signals; and
    the adjusting circuit includes a control circuit having a second current mirror and selectively pulls more current from one of the drive side and the driven side based on the detected offset voltage.

17. The input circuit of claim 16, wherein
    the receiver circuit includes a differential amplifier having a first input connected to the drive side and second input connected to the driven side, and the differential amplifier producing the generated data signal in response to the first and second output signals.

18. The input circuit of claim 1, wherein the detecting circuit detects the offset voltage based on output from the adjusting circuit.

19. The input circuit of claim 18, wherein
    the adjusting circuit generates first and second control signals to adjust operation of the receiving circuit; and
    the detecting circuit compares the first and second control signals to detect the offset voltage.

20. The input circuit of claim 19, wherein the detecting circuit filters high frequency components of the first and second control signals and compares the filtered first and second control signals to detect the offset voltage.

21. The input circuit of claim 20, wherein the detecting circuit generates first and second voltages representing the detected offset voltage based on the comparison.

22. The input circuit of claim 21, wherein
the receiver circuit includes a current mirror having a drive side and a driven side, the drive side having an input receiving a first of the pair of differential data signals, and the driven side having an input receiving a second of the pair of differential data signals; and
the adjusting circuit selectively pulls more current from one of the drive side and the driven side based on the first and second voltages.

23. The input circuit of claim 22, wherein
the detecting circuit generates the first voltage to be greater than the second voltage when the detected offset is positive; and
the adjusting circuit generates the first and second control signals to pull more current from the driven side when the first voltage is greater than the second voltage.

24. The input circuit of claim 22, wherein
the detecting circuit generates the second voltage to be greater than the first voltage when the detected offset is negative;
the adjusting circuit generates the first and second control signals to pull more current from the drive side when the second voltage is greater than the first voltage.

25. An input circuit, comprising:
a receiver circuit generating a data signal based on a pair of differential data signals;
a detecting circuit detecting an offset voltage between the pair of differential data signals; and
an adjusting circuit adjusting operation of the receiver to converge a duty ratio of the data signal towards 50% based on the detected offset voltage.

26. A method of reducing influences of offset in an input circuit, comprising:
generating a data signal based on a pair of differential data signals;
detecting an offset voltage between the pair of differential data signals; and
adjusting the generating step to reduce the detected offset voltage based on the detected offset voltage.

27. The method of claim 26, wherein the detecting step detects the offset voltage based on the generated data signal.

28. The method of claim 26, wherein
the detecting step generates first and second voltage representative of the detected offset voltage; and
the adjusting step adjusts the generating step based on the first and second voltages.

29. An input circuit, comprising:
an adjusting circuit receiving a pair of differential data signals and adjusting the pair of differential data signals to generate a pair of adjusted differential data signals such that a magnitude of an offset voltage between the pair of differential data signals is reduced in the pair of adjusted differential data signals; and
a receiver circuit generating a data signal based on the pair of adjusted differential data signals.

30. The input circuit of claim 29, wherein the adjusting circuit adjusts the pair of differential data signals to generate the pair of adjusted differential data signals such that a duty ratio of the data signal converges towards a 50% duty ratio.

31. The input circuit of claim 29, wherein the adjusting circuit includes a detecting circuit detecting the offset voltage based on the generated data signal.

32. The input circuit of claim 31, wherein the detecting circuit compares the generated data signal to a reference voltage to detect the offset voltage.

33. The input circuit of claim 32, wherein the detecting circuit generates first and second voltages representing the detected offset voltage based on the comparison such that the first voltage increases with respect to the reference voltage as the generated data signal exceeds the reference voltage and the second voltage decreases with respect to the reference voltage as the generated data signal exceeds the reference voltage.

34. The input circuit of claim 29, wherein the detecting circuit filters high frequency components of the pair of adjusted differential data signals and compares the filtered pair of adjusted differential data signals to detect the offset voltage.

35. The input circuit of claim 29, wherein the adjusting circuit comprises:
a detecting circuit generating first and second voltages representing a detected offset voltage between the pair of differential data signals; and
an offset adjust circuit adjusting the pair of differential data signals to generate the pair of adjusted differential data signals based on the first and second voltages.

36. The input circuit of claim 35, wherein the offset adjust circuit generates a first of the pair of adjusted differential data signals based on a comparison of the second voltage with a first of the pair of differential data signals and generates a second of the pair of adjusted differential data signals based on a comparison of the first voltage with a second of the pair of differential data signals.

37. The input circuit of claim 36, wherein the detecting circuit generates the first and second voltages such that a magnitude of a difference between the first and second voltages decreases as the detected offset decreases.

38. The input circuit of claim 29, wherein receiver circuit includes a current mirror having a drive side and a driven side, the drive side having an input receiving a first of the pair of adjusted differential data signals, and the driven side having an input receiving a second of the pair of adjusted differential data signals.

39. The input circuit of claim 29, wherein the adjusting circuit comprises:
a first low pass filter filtering a first of the pair of differential data signals;
a second low pass filter filtering a second of the pair of differential data signals;
a first generator generating a first of the pair of adjusted differential data signals based on a comparison of the filtered second differential data signal and the second differential data signal; and
a second generator generating a second of the pair of adjusted differential data signals based on a comparison of the filtered first differential data signal and the first differential data signal.

40. The input circuit of claim 39, wherein the receiver circuit includes a current mirror having a drive side and a driven side, the drive side having an input receiving the first adjusted differential data signals, and the driven side having an input receiving the second adjusted differential data signal.

41. The input circuit of claim 29, wherein
the adjusting circuit determines a first DC voltage for a first of the pair of differential data signals and determines a second DC voltage for a second of the pair of differential data signals, and the adjusting circuit includes,
a first generator generating a first of the pair of adjusted differential data signals based on a comparison of the second DC voltage and the second differential data signal; and a second generator generating a second of the pair of adjusted differential data signals based on a comparison of the first DC voltage and the first differential data signal.

42. An input circuit, comprising:
a detector detecting an offset voltage between a pair of differential data signals; and
a data signal generator generating a data signal based on the pair of differential data signals and the detected offset voltage such that a magnitude of the detected offset voltage is reduced.

43. A memory system, comprising:
a memory controller outputting at least a pair of differential data signals; and
a memory module including at least one memory device having an input circuit, the input circuit including,
   a receiver circuit generating a data signal based on the pair of differential data signals;
   a detecting circuit detecting an offset voltage between the pair of differential data signals; and
   an adjusting circuit adjusting operation of the receiver to reduce a magnitude of the detected offset voltage based on the detected offset voltage.

44. A memory device, comprising:
an input circuit, the input circuit including,
   a receiver circuit generating a data signal based on a pair of differential data signals,
   a detecting circuit detecting an offset voltage between the pair of differential data signals, and
   an adjusting circuit adjusting operation of the receiver to reduce a magnitude of the detected offset voltage based on the detected offset voltage; and
a memory section storing the data signal.

45. The memory device of claim 44, wherein the detecting circuit generates first and second voltages representing the detected offset voltage.

46. The memory device of claim 44, wherein
the receiver circuit includes a current mirror having a drive side and a driven side, the drive side having an input receiving a first of the pair of differential data signals, and the driven side having an input receiving a second of the pair of differential data signals; and
the adjusting circuit selectively pulls more current from one of the drive side and the driven side based on the detected offset voltage.

* * * * *